US012210338B2

(12) United States Patent
Matsumoto et al.

(10) Patent No.: US 12,210,338 B2
(45) Date of Patent: Jan. 28, 2025

(54) COMPUTER SYSTEM OF OBSERVATION DEVICE AND PROCESSING METHOD

(71) Applicant: Hitachi High-Tech Corporation, Tokyo (JP)

(72) Inventors: Kosuke Matsumoto, Tokyo (JP); Satoshi Takada, Tokyo (JP); Hideki Nakayama, Tokyo (JP); Miyuki Fukuda, Tokyo (JP); Kozo Miyake, Tokyo (JP); Yuya Isomae, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 124 days.

(21) Appl. No.: 17/456,228

(22) Filed: Nov. 23, 2021

(65) Prior Publication Data

US 2022/0187810 A1 Jun. 16, 2022

(30) Foreign Application Priority Data

Dec. 11, 2020 (JP) ................................. 2020-205598

(51) Int. Cl.
*G05B 19/418* (2006.01)
*G06T 7/00* (2017.01)

(52) U.S. Cl.
CPC ... *G05B 19/41875* (2013.01); *G05B 19/4184* (2013.01); *G06T 7/0004* (2013.01)

(58) Field of Classification Search
CPC .......... G05B 19/41875; G05B 19/4184; G06T 7/0004; G06T 2207/30148; G06T 7/73;
(Continued)

(56) References Cited

U.S. PATENT DOCUMENTS 9,098,891 B2 8/2015 Kulkarni et al.
9,165,356 B2 10/2015 Harada et al.
(Continued)

FOREIGN PATENT DOCUMENTS

JP          4661075 B2  *  3/2011
JP       2013-33875 A       2/2013
(Continued)

OTHER PUBLICATIONS

Taiwanese-language Office Action issued in Taiwanese Application No. 110140972 dated Sep. 13, 2022 with English translation (14 pages).

(Continued)

*Primary Examiner* — Thomas C Lee
*Assistant Examiner* — Michael Tang
(74) *Attorney, Agent, or Firm* — Crowell & Moring LLP

(57) ABSTRACT

As a technology for an observation device and an inspection device, a technology capable of reducing a work effort related to generation of a recipe including alignment information is provided. An observation device 1 includes an observation unit 103 that obtains an image for observing a sample 101 on a stage 102. A computer system 2 of the observation device 1 acquires the image from the observation unit 103, specifies a period of a pattern-formed unit region repeatedly formed on a surface of the sample 101 from the image, and generates a recipe including observation or inspection alignment positions of the sample 101 using the specified period.

8 Claims, 18 Drawing Sheets

(58) Field of Classification Search
CPC ............ G06T 2207/20056; G06T 7/42; G06T 2207/10061; G06T 7/001; G06T 7/70; G06T 1/0007; G06T 2200/24; H01J 2237/221; H01J 2237/2817; H01J 2237/2811; H01L 22/20; G06F 3/0484; G06V 10/44
USPC .......................................... 700/121; 382/145
See application file for complete search history.

(56) References Cited

U.S. PATENT DOCUMENTS

| | | |
|---|---|---|
| 9,390,886 B2 | 7/2016 | Nakasuji et al. |
| 9,846,931 B2 | 12/2017 | Toyoda et al. |
| 10,417,756 B2 | 9/2019 | Sakai et al. |
| 2004/0255198 A1* | 12/2004 | Matsushita ............. H01L 22/20 714/37 |
| 2008/0081385 A1* | 4/2008 | Marella ................ G01N 21/956 257/E21.521 |
| 2013/0250297 A1 | 9/2013 | Ito et al. |
| 2013/0329039 A1 | 12/2013 | Sakai |
| 2014/0177940 A1 | 6/2014 | Nakagaki et al. |
| 2016/0125590 A1* | 5/2016 | Yoshida ................. H01L 22/12 348/87 |
| 2018/0012349 A1* | 1/2018 | Sakai ..................... G06T 7/0004 |
| 2018/0218492 A1* | 8/2018 | Zhang .................. G06T 7/0006 |
| 2020/0151844 A1 | 5/2020 | Kitajima et al. |
| 2021/0111075 A1* | 4/2021 | Ohkubo ............... B23K 26/402 |

FOREIGN PATENT DOCUMENTS

| | | | |
|---|---|---|---|
| JP | 2013-58654 A | 3/2013 | |
| JP | 2013-195175 A | 9/2013 | |
| JP | 2020-77397 A | 5/2020 | |
| KR | 10-2007-0116602 A | 12/2007 | |
| KR | 20160061747 A * | 6/2016 | |
| TW | 201508697 A * | 3/2015 | ............. H01J 37/28 |
| TW | 1604177 B | 11/2017 | |

OTHER PUBLICATIONS

Korean-language Office Action issued in Korean Application No. 10-2021-0147636 dated Nov. 17, 2023 with English translation (29 pages).

Korean-language Office Action issued in Korean Application No. 10-2021-0147636 dated Jun. 26, 2024 with English Translation (21 pages).

* cited by examiner

[FIG. 1]
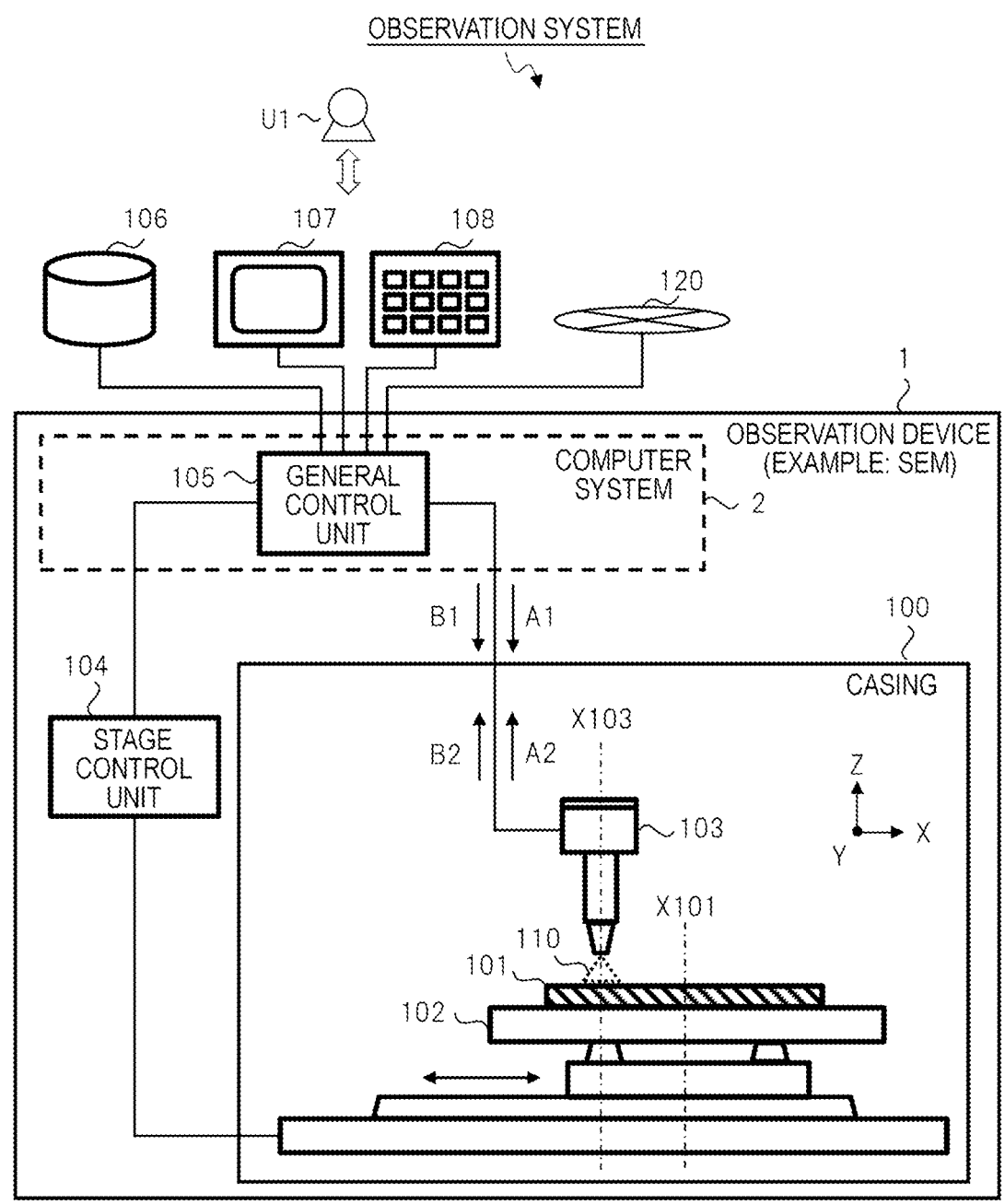

[FIG. 2]
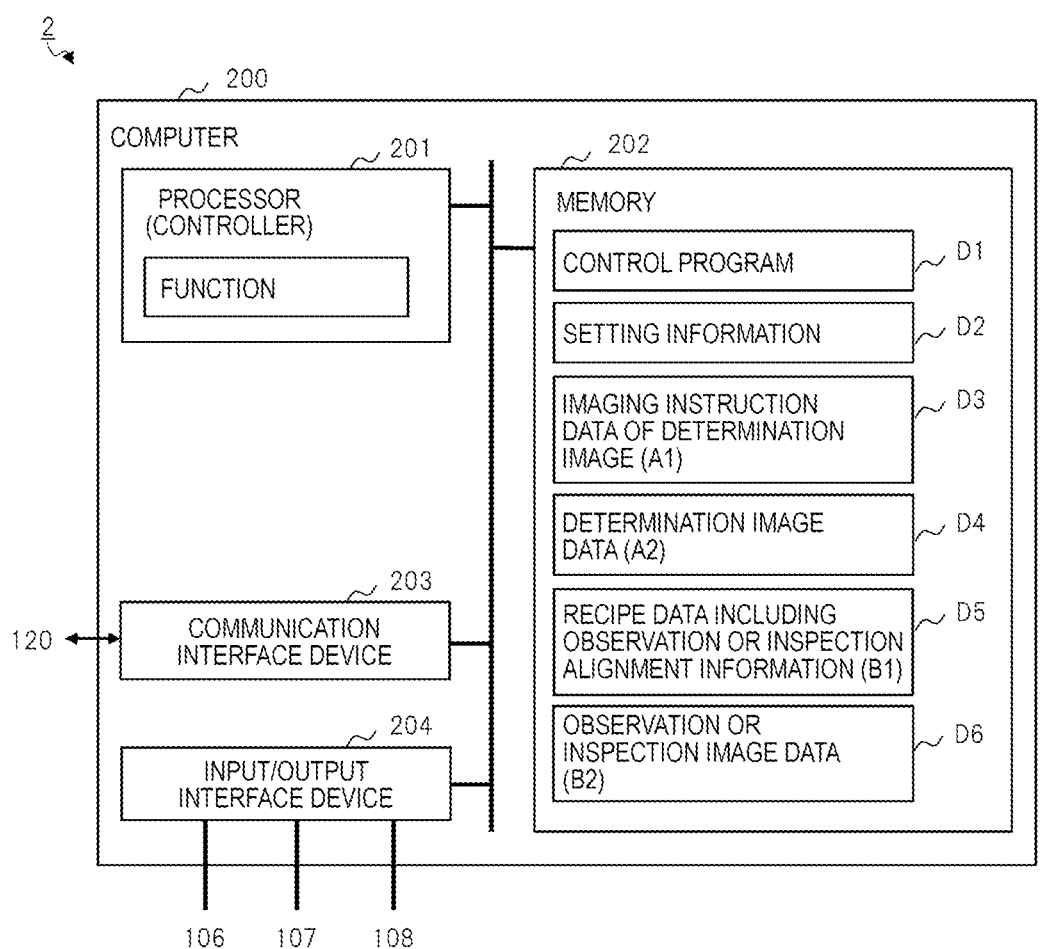

[FIG. 3]
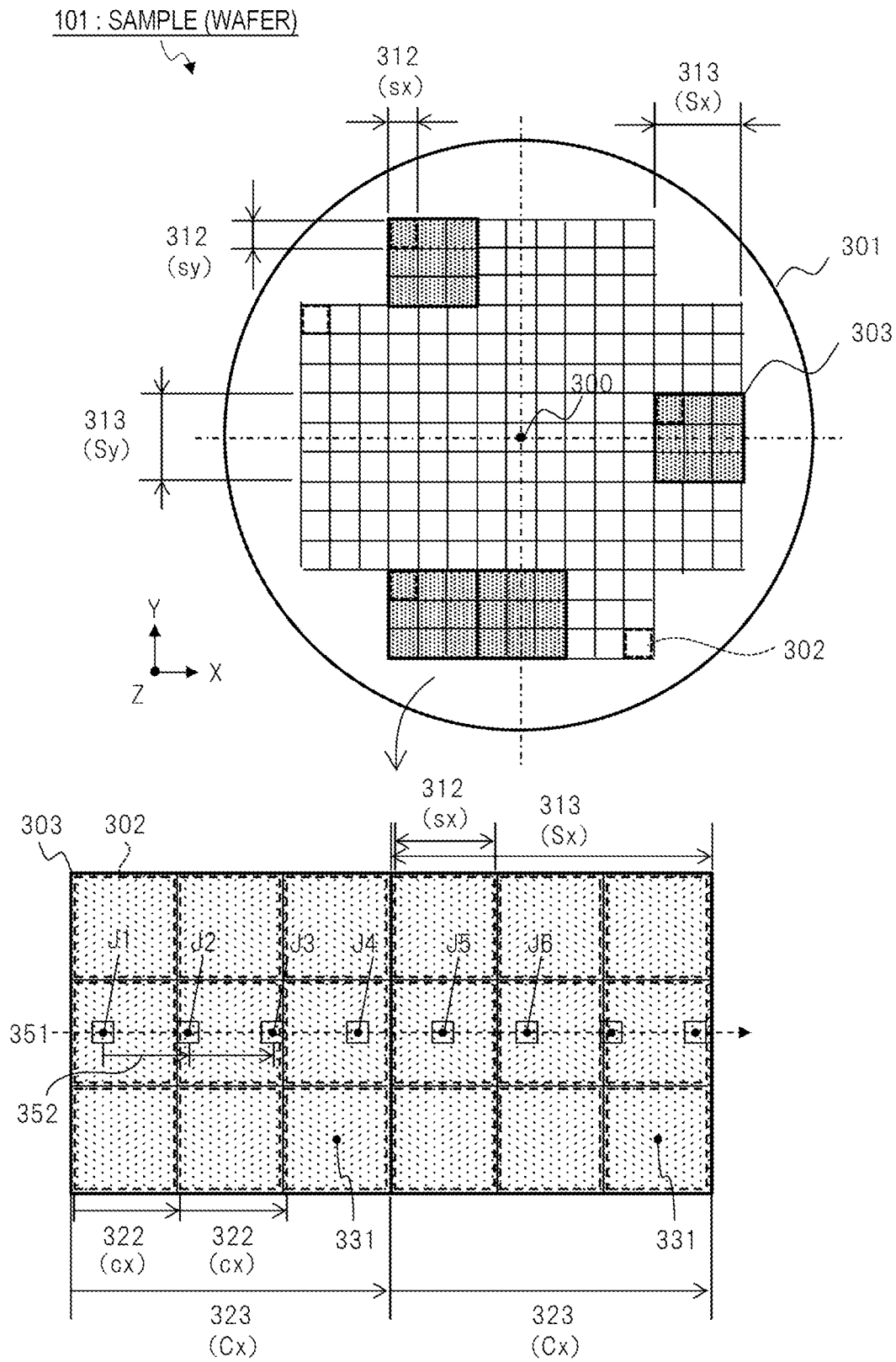

[FIG. 4]
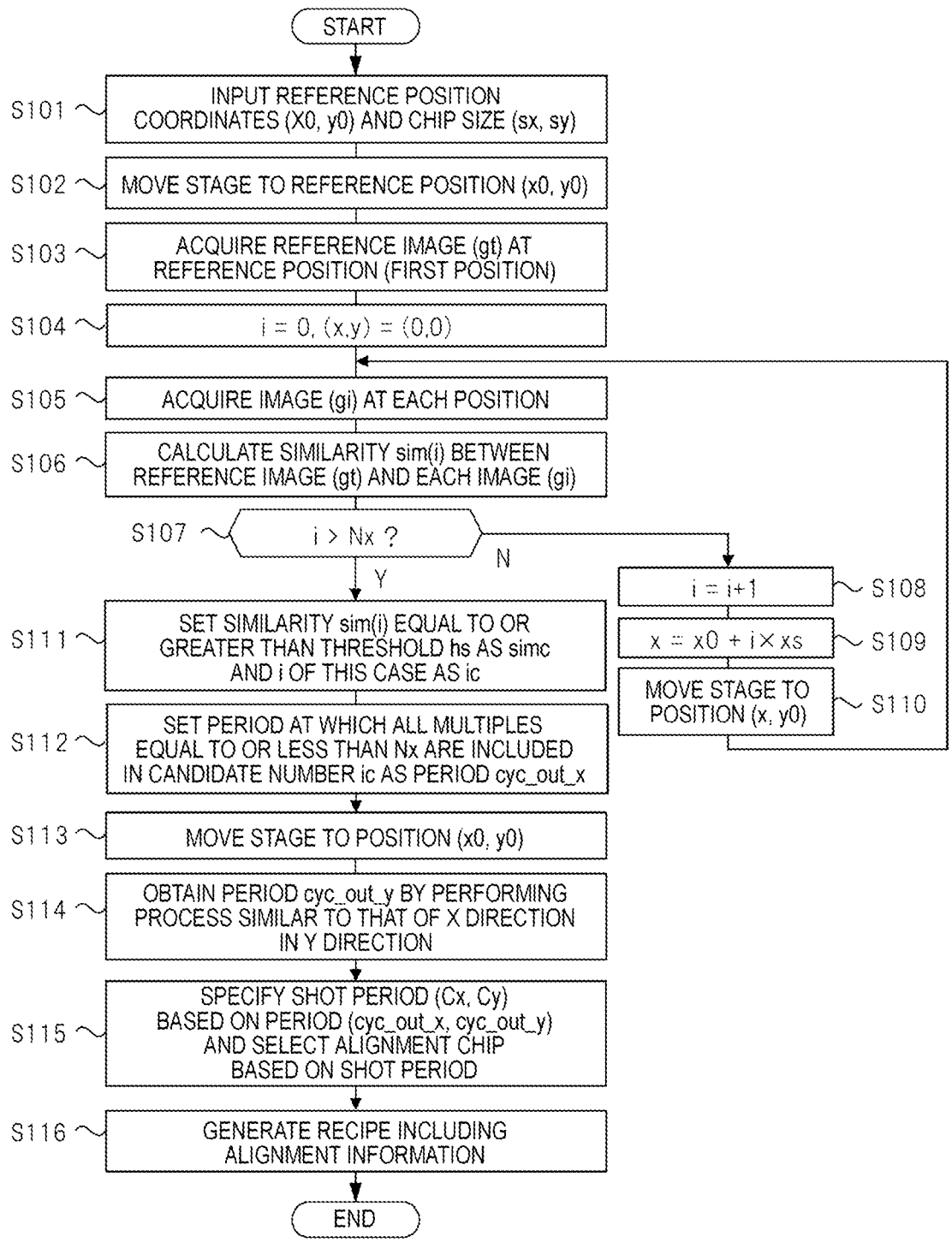

[FIG. 5]
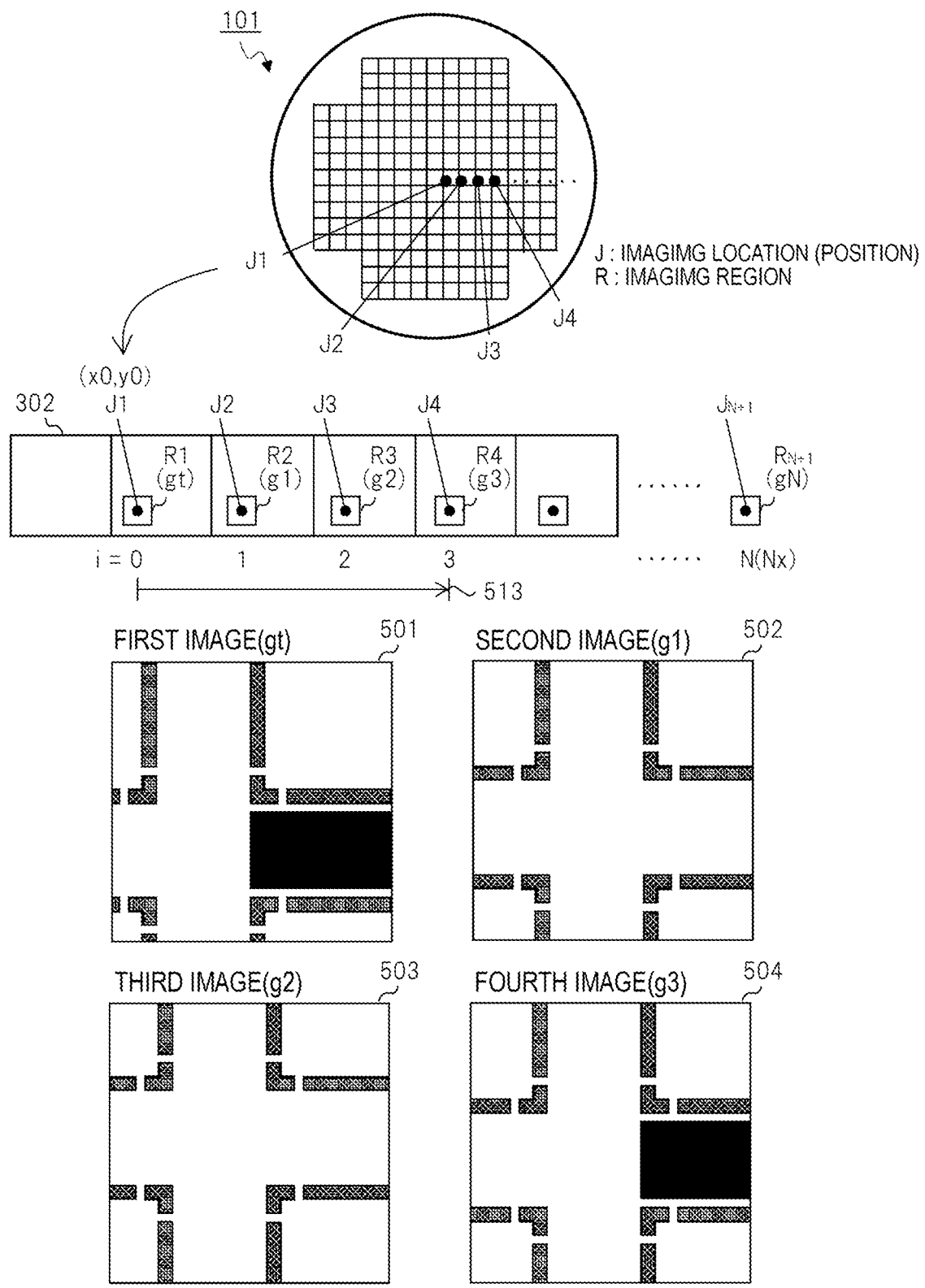

[FIG. 6]
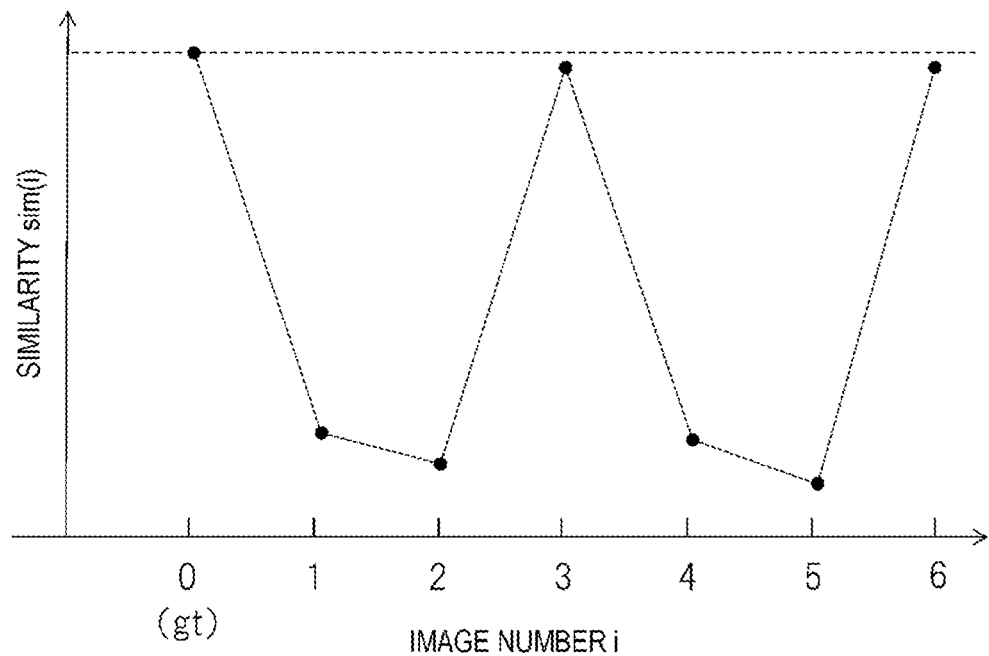
[FIG. 7]
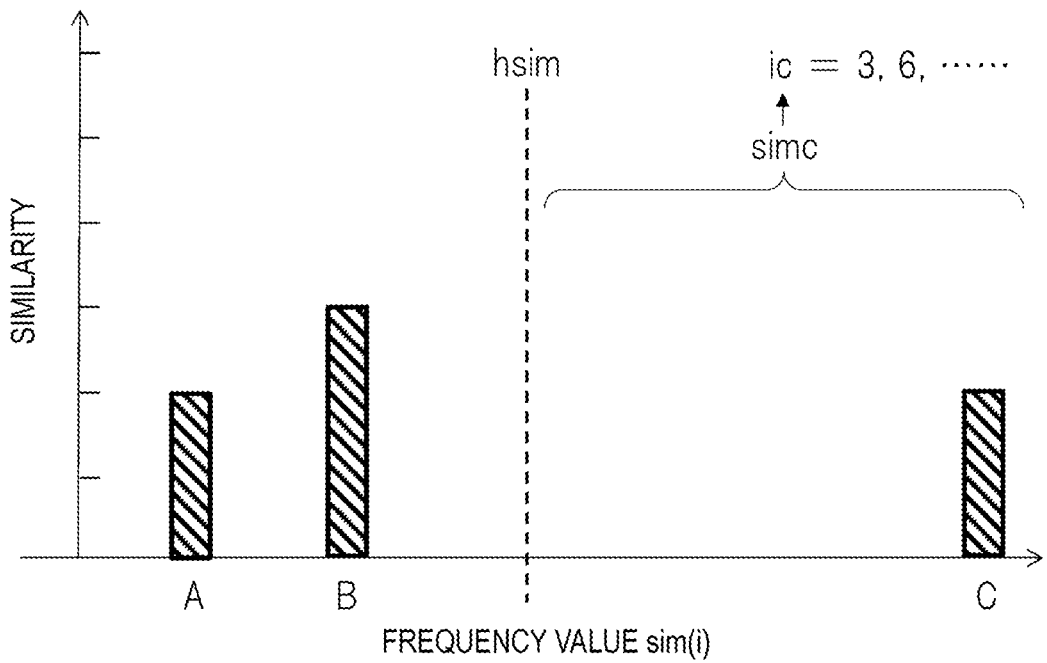

[FIG. 8]
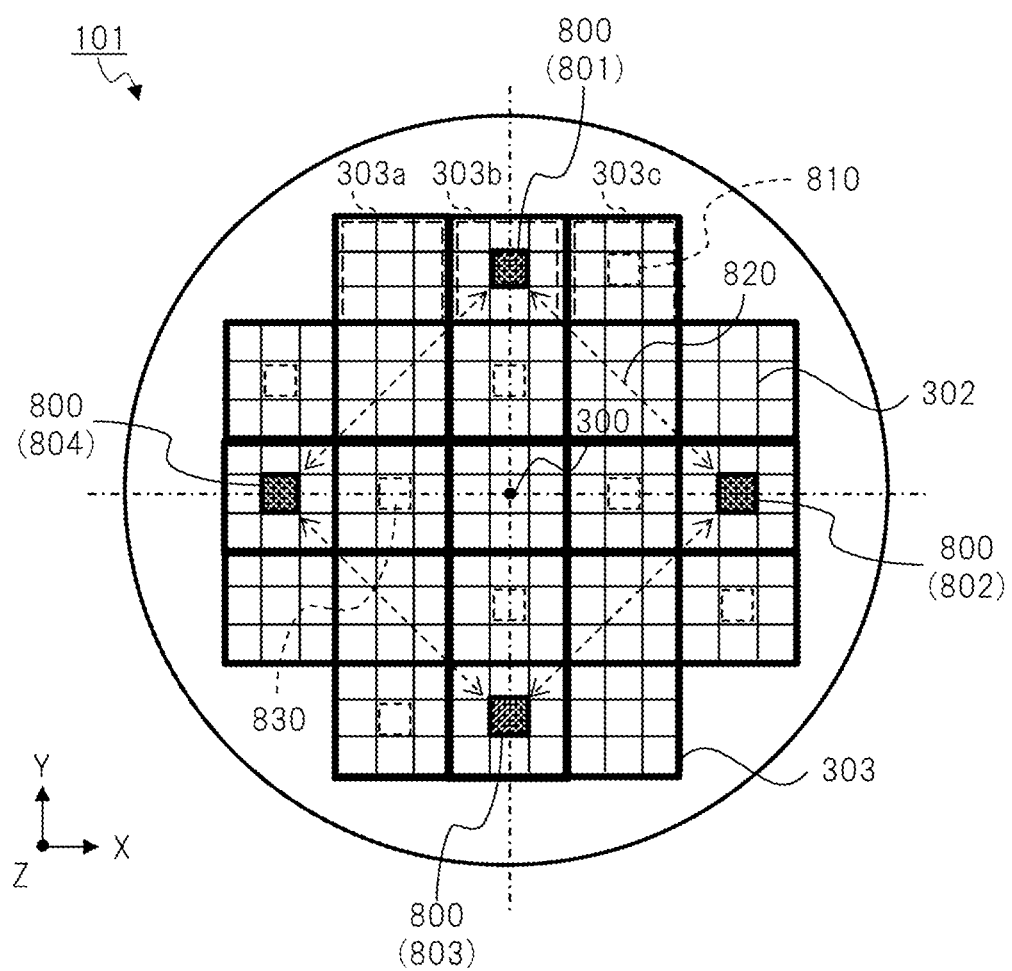

[FIG. 9]
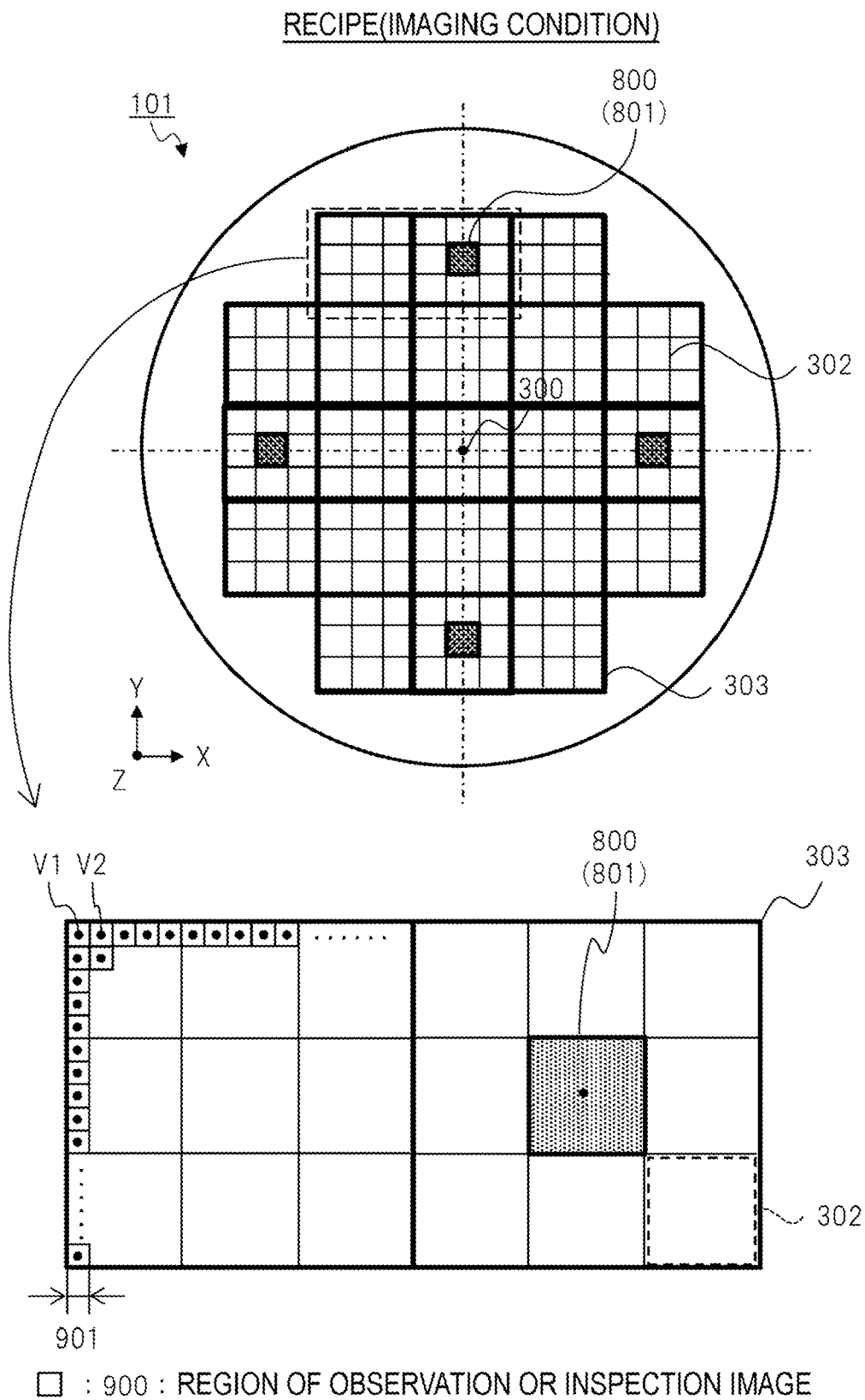

[FIG. 10]
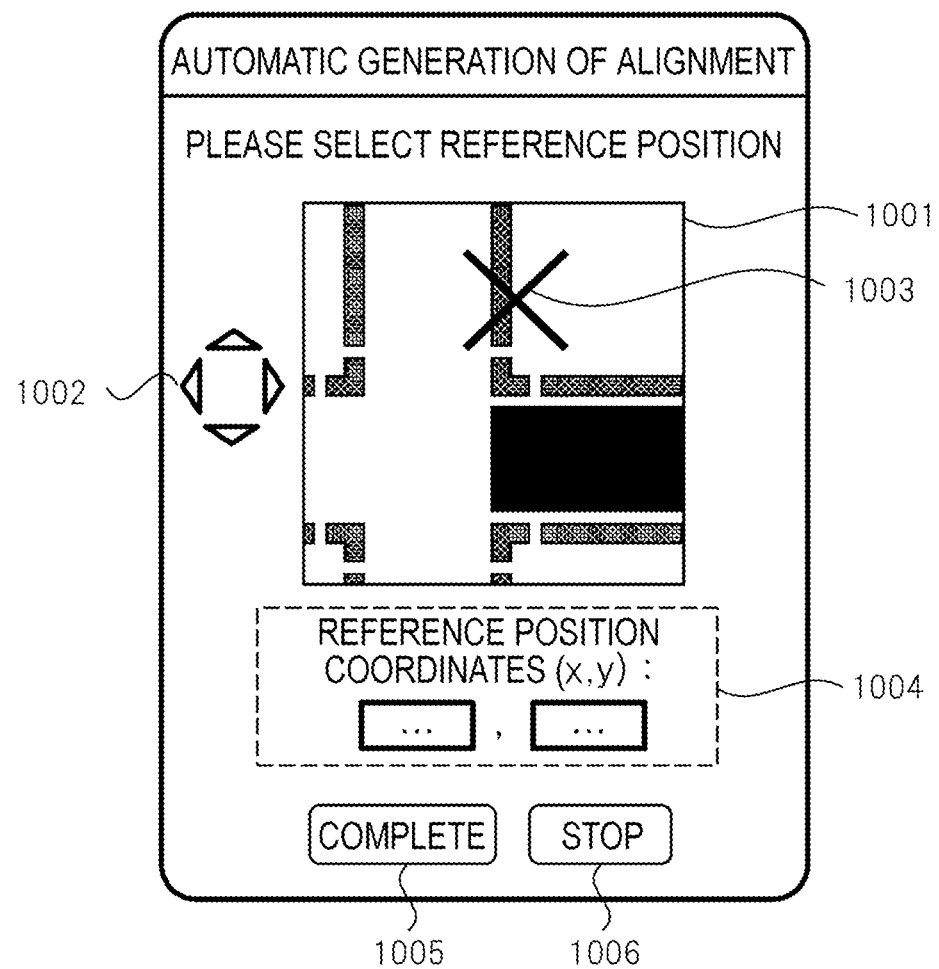

[FIG. 11]
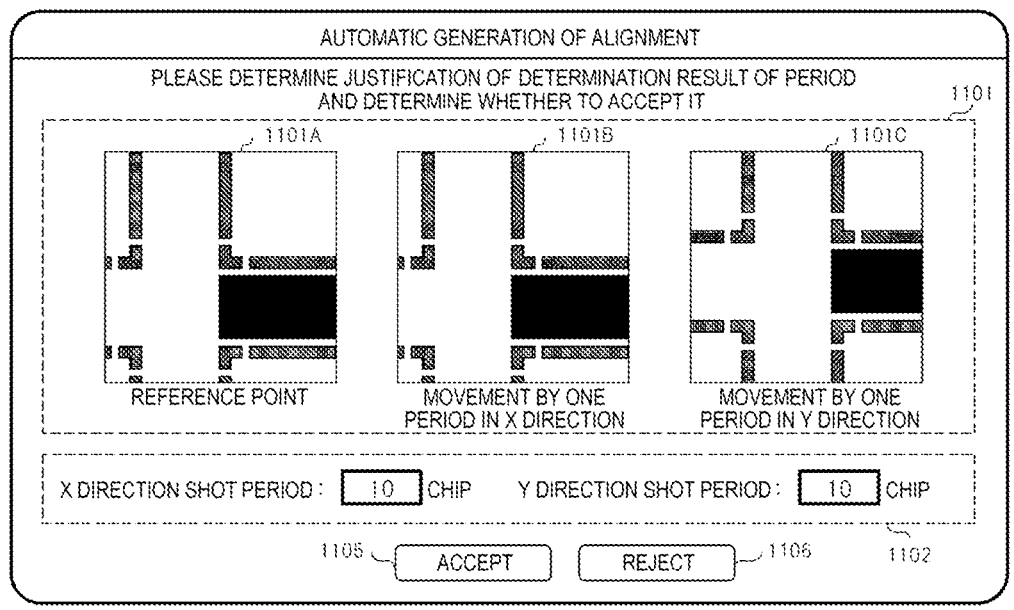

[FIG. 12]
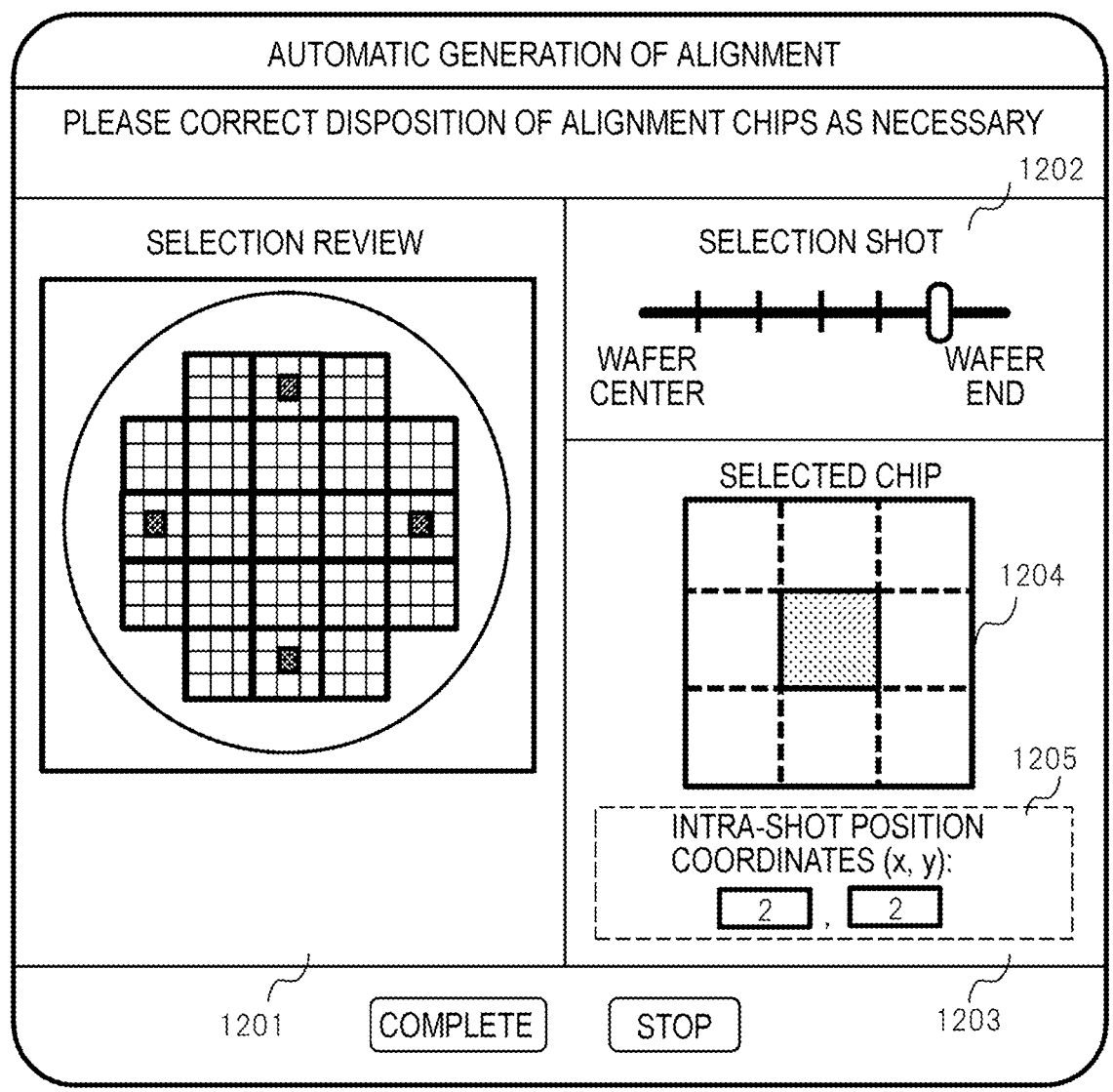

[FIG. 13]
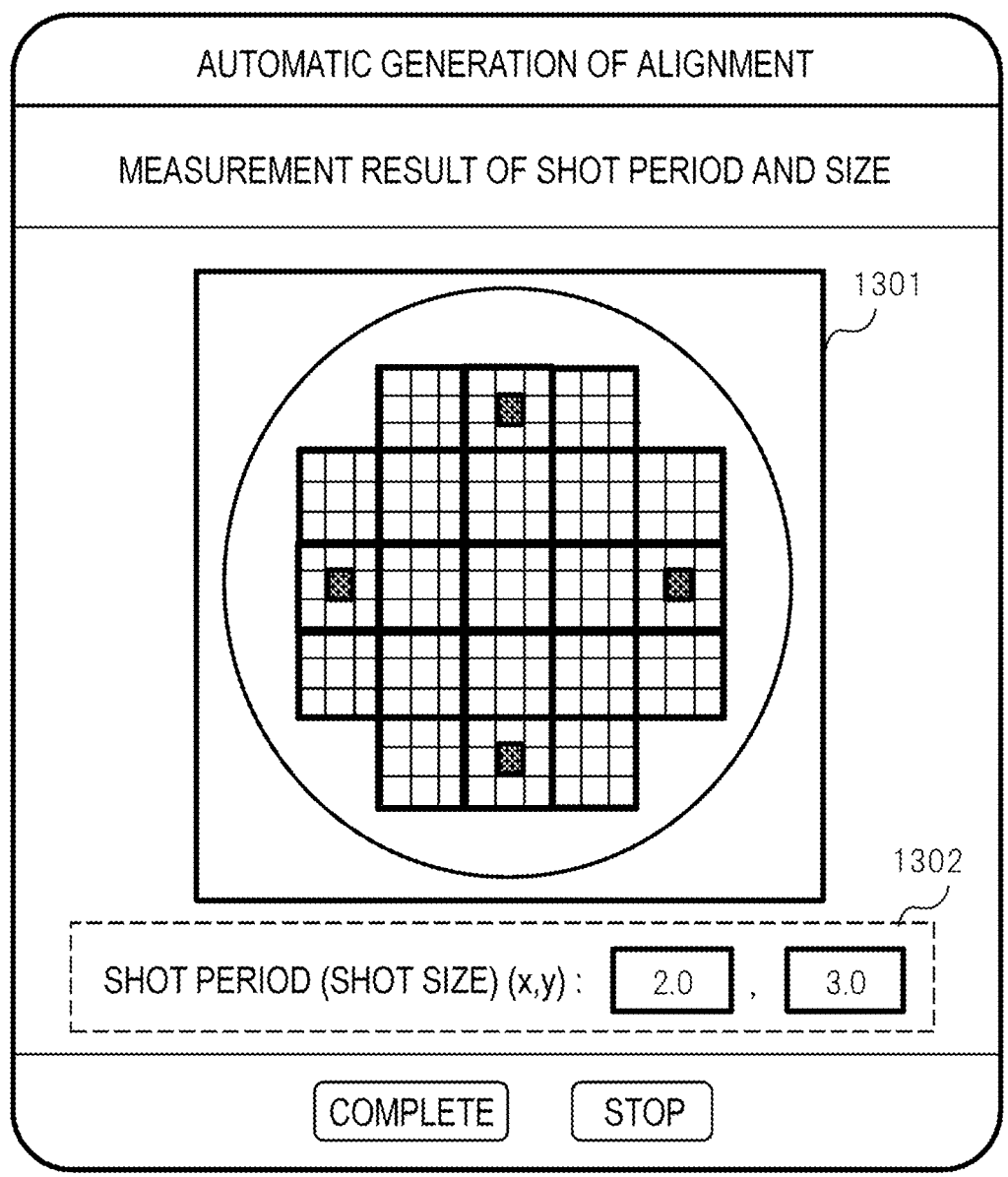

[FIG. 14]
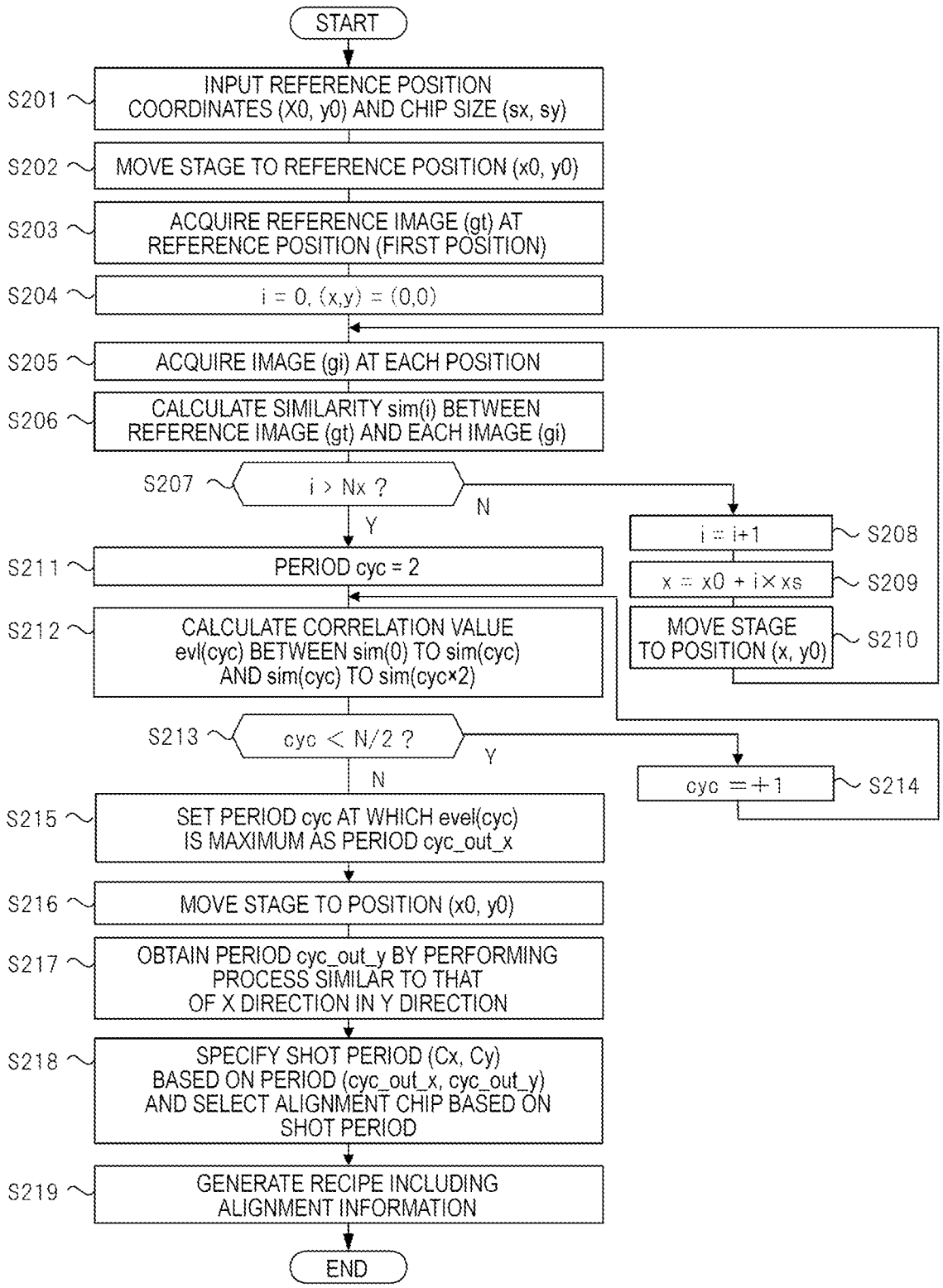

[FIG. 15]
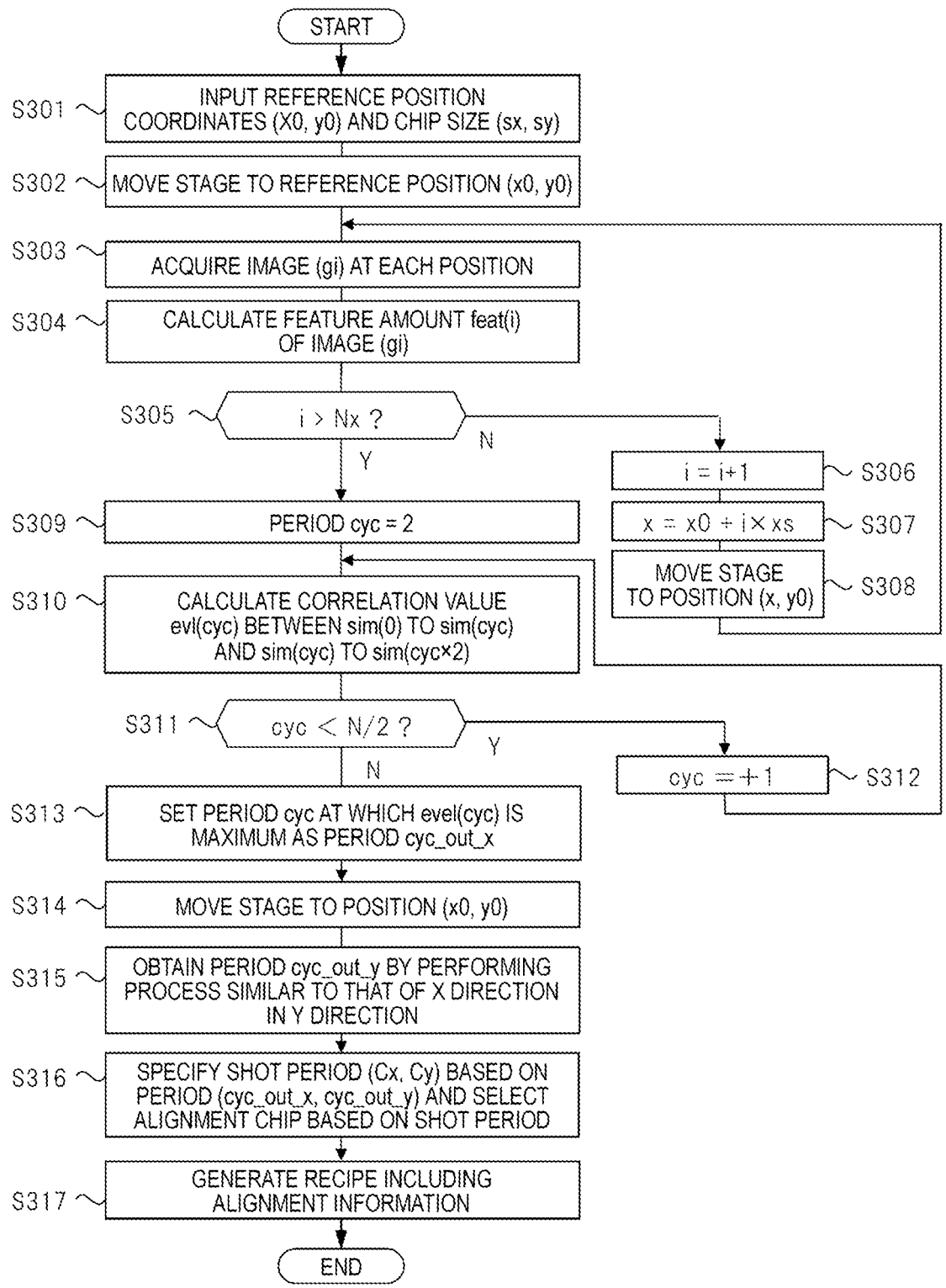

[FIG. 16]
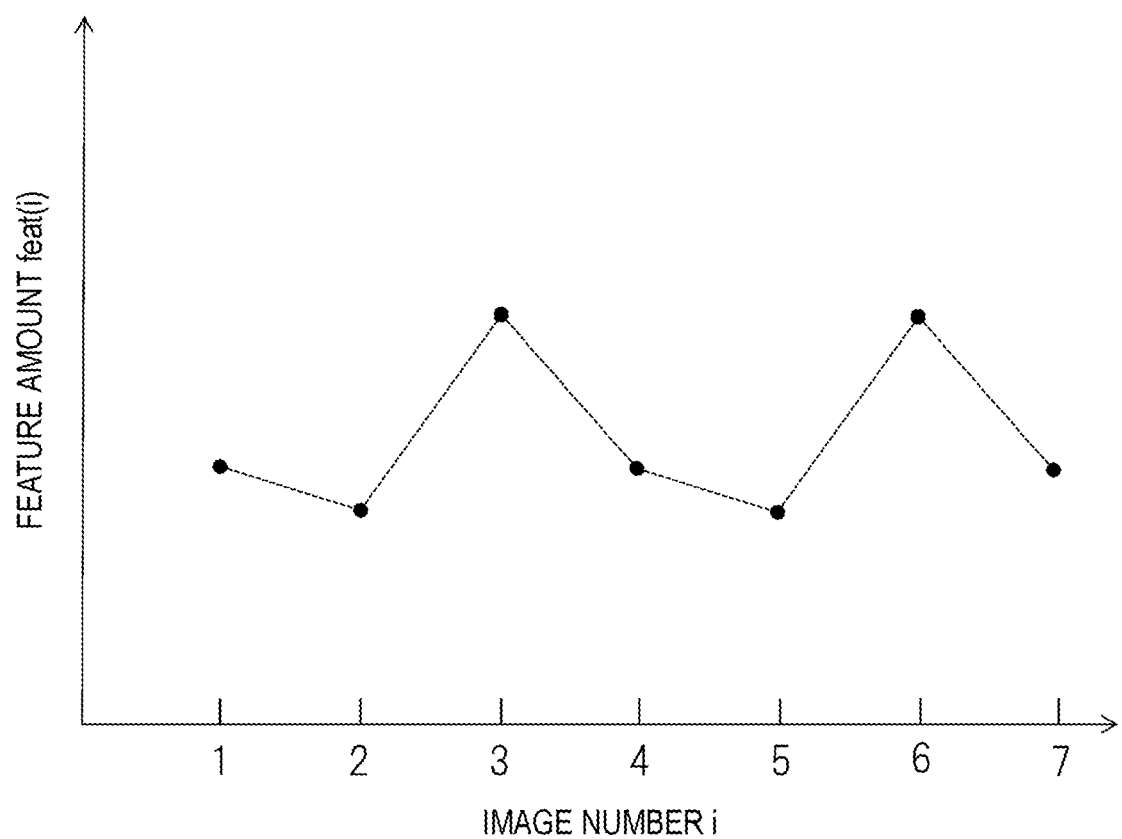

[FIG. 17]
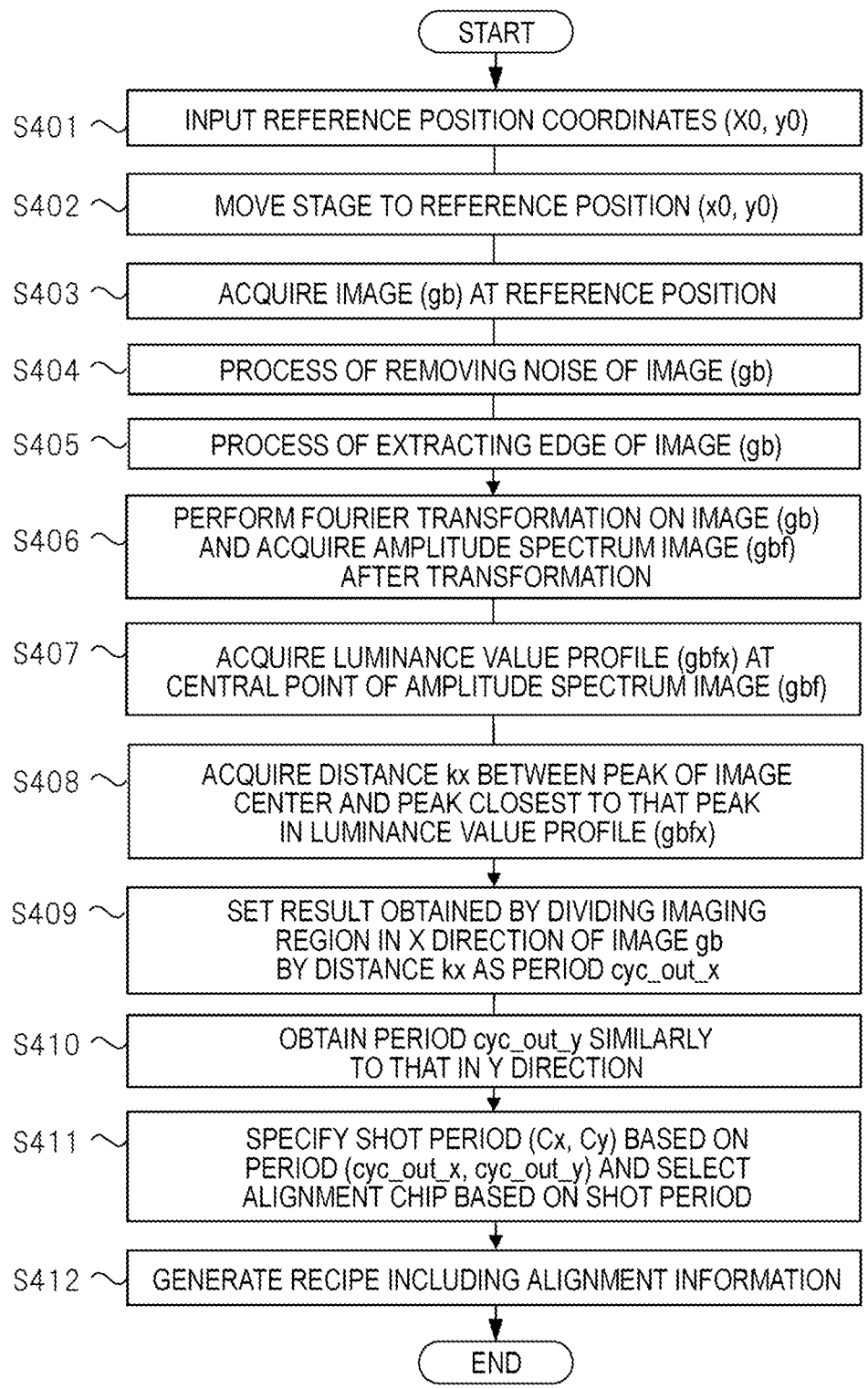

[FIG. 18]
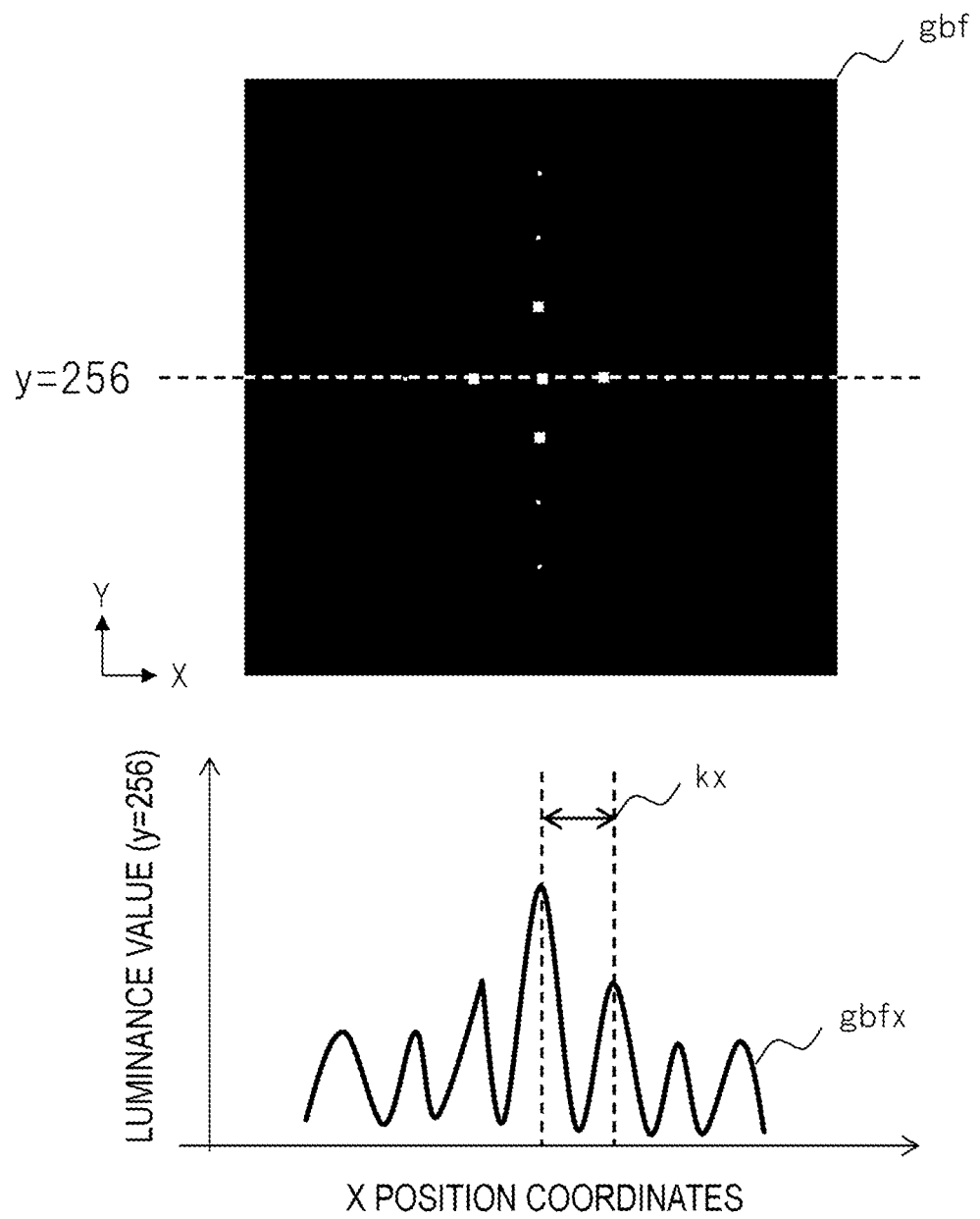

[FIG. 19]
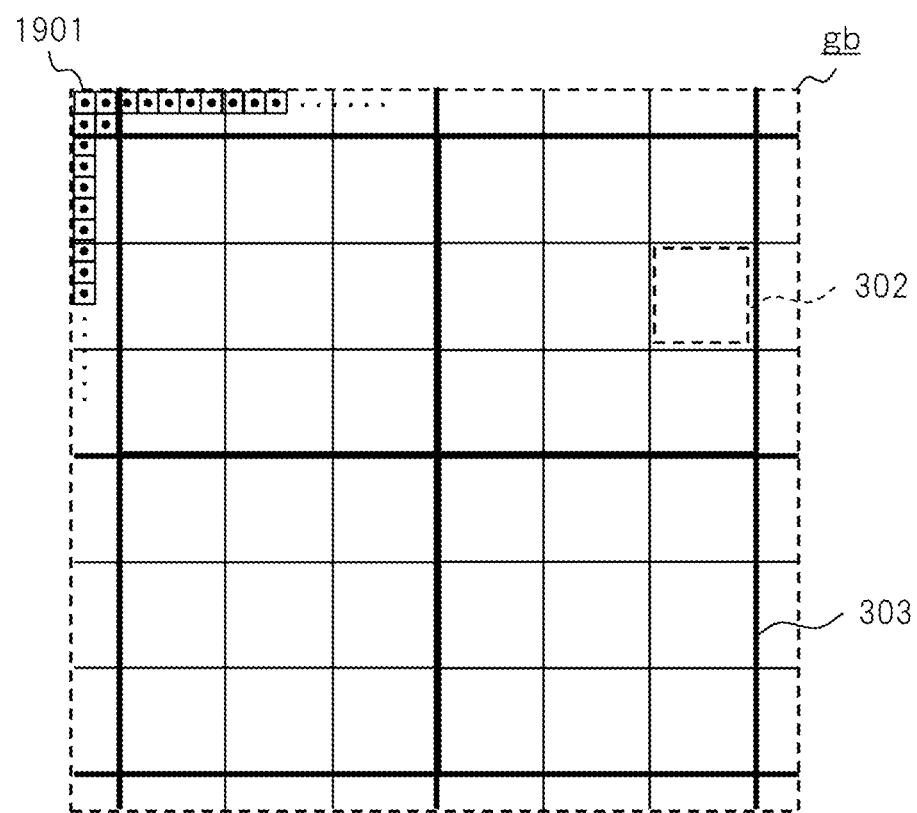

COMPUTER SYSTEM OF OBSERVATION DEVICE AND PROCESSING METHOD

TECHNICAL FIELD

The present disclosure relates to a technology for an observation device, an inspection device, or the like targeting a sample such as a semiconductor device.

BACKGROUND ART

For example, in semiconductor industries, devices are formed in a plurality of minute and complex processes. Foreign matters generated in processes or defects of circuit patterns are causes that have considerable influences on performance of devices. Therefore, to improve yields of devices, it is very important to ascertain and manage foreign matters or defects on devices in manufacturing processes.

As observation devices or inspection devices targeting samples such as semiconductor devices and observing external appearances such as foreign matters, defects, or the like on the surfaces of devices, there are optical microscopes, scanning electron microscopes (SEM), or the like. One of the observation devices is particularly, a review SEM. A review SEM moves an observation position to a defect position on a wafer based on defect position information which is an output of a semiconductor inspection device, and images and observes an external appearance of a defect. The review SEM is assumed to be automatically run in a manufacturing process of a general device.

As an exemplary technology of the related art, JP-A-2020-77397 (PTL 1) can be exemplified. PTL 1 discloses that a model in which, as an image processing method or the like, a high speed of an image inspection process using pattern matching is not impaired and error detection is low without depending on a background, noise, the shape of a work, or the like can be generated.

CITATION LIST

Patent Literature

PTL 1: JP-A-2020-77397

SUMMARY OF INVENTION

Technical Problem

In running of, for example, a review SEM which is an observation device, it is necessary for a user to perform work of generating and setting a consecutive imaging program (called a recipe in some cases) for observation or inspection in which alignment information or imaging information such as an imaging condition of an SEM image is set and recorded is generated and set in advance. The alignment information is information for aligning a position (also referred to as stage position coordinates in some cases) of a sample on a stage with respect to an observation unit (in other words, positioning or position correction) and is, for example, information indicating a plurality of positions in the surface of a wafer. The observation unit is a mechanism or the like that radiates a charged particle beam in the case of the SEM. The imaging condition is a condition such as a position, a size, brightness, and a timing when a plurality of locations on the surface of a sample for an observation or inspection are targeted and a plurality of images are consecutively captured.

In the technology of the related art, the following scheme is generally used in alignment in an observation device such as a review SEM. In this scheme, template matching is used for searching near stage position coordinates of a template pattern based on a characteristics template pattern (in other words, a pattern-formed unit region serving as a reference) in the surface of a wafer and a plurality of position coordinates which are searching targets, which are registered as a part of a recipe in advance. The template matching is matching between an image of a template pattern serving as a reference and an image of a test pattern region of a searching target position. In this scheme, when a result of the template matching exceeds a threshold, a difference between the registration position coordinates of the test pattern and the detected position coordinates is corrected.

In such a scheme of the related art, it is necessary for a user to perform work of designating and setting information including the image of the template pattern and the plurality of registration position coordinates in advance. It is necessary to set the registered template pattern as a unique pattern and it is necessary to set the registration position coordinates of the test pattern as position coordinates considered so that an image with the same shape as that of the template pattern can be obtained. To guarantee alignment accuracy, it is preferable that the plurality of test patterns are as distant on the surface of the wafer as possible.

In the technology of the related art, a work effort is large when a user generates a recipe including the alignment information. Since a time required to generate the recipe including the alignment information is directly linked to productivity of a device, simplicity and the number of processes necessary to generate the recipe are important performance indexes of an observation device such as a review SEM.

An objective of the present disclosure is to provide a technology capable of reducing a work effort related to generation of a recipe including alignment information with regard to a technology of the observation device and the inspection device.

Solution to Problem

A representative embodiment of the present disclosure has the following configuration. An embodiment is a computer system of an observation device. The observation device includes an observation unit that obtains an image for observing a sample on a stage. The computer system acquires the image from the observation unit, specifies a period of a pattern-formed unit region repeatedly formed on a surface of the sample from the image, and generates a recipe including observation or inspection alignment positions of the sample using the specified period.

Advantageous Effects of Invention

According to the representative embodiment of the present disclosure, it is possible to reduce a work effort related to generation of a recipe including alignment information with regard to a technology of the observation device and the inspection device. The other problems, advantageous effects, and the like will be described in [Description of Embodiments].

BRIEF DESCRIPTION OF DRAWINGS

FIG. 1 is a diagram illustrating a configuration of an observation system including a computer system of an observation device according to a first embodiment.

FIG. 2 is a diagram illustrating an exemplary configuration of the computer system according to the first embodiment.

FIG. 3 is a diagram illustrating an exemplary configuration of a sample surface according to the first embodiment.

FIG. 4 is a flowchart illustrating a process according to the first embodiment.

FIG. 5 is a diagram illustrating an example of imaging of a determination image according to the first embodiment.

FIG. 6 is a diagram illustrating an example of similarity according to the first embodiment.

FIG. 7 is a diagram illustrating an example of comparison between similarity and a threshold according to the first embodiment.

FIG. 8 is a diagram illustrating an example of selection of an alignment chip according to the first embodiment.

FIG. 9 is a diagram illustrating an example of an imaging condition of a recipe according to the first embodiment.

FIG. 10 is a diagram illustrating Part 1 of an exemplary GUI screen according to the first embodiment.

FIG. 11 is a diagram illustrating Part 2 of the exemplary GUI screen according to the first embodiment.

FIG. 12 is a diagram illustrating Part 3 of the exemplary GUI screen according to the first embodiment.

FIG. 13 is a diagram illustrating Part 4 of the exemplary GUI screen according to the first embodiment.

FIG. 14 is a flowchart illustrating a process in a computer system of an observation device according to a second embodiment.

FIG. 15 is a flowchart illustrating a process in a computer system of an observation device according to a third embodiment.

FIG. 16 is a diagram illustrating a feature amount according to the third embodiment.

FIG. 17 is a flowchart illustrating a process in a computer system of an observation device according to a fourth embodiment.

FIG. 18 is a diagram illustrating an amplitude spectrum image and a luminance value profile according to the fourth embodiment.

FIG. 19 is a diagram illustrating one test image according to the fourth embodiment.

DESCRIPTION OF EMBODIMENTS

Hereinafter, embodiments of the present disclosure will be described in detail with reference to the drawings. In the drawings, the same reference numerals are given to the same units in principle and repeated description thereof will be omitted. In the drawings, to facilitate understanding, expressions of constituent elements do not indicate actual positions, sizes, shapes, ranges, and the like in some cases.

To facilitate description, when a process according to a program is described, the program, a function, processing, or the like serves as an entity in the description in some cases. However, an entity which is hardware for it is a processor or, a controller, a device, a computer, a system, or the like configured by the processor. In the computer, a processor performs a process according to a program read on a memory while appropriately using resources such as a memory and a communication interface. Thus, a predetermined function, a processing unit, or the like is realized. The processor is configured by, for example, a semiconductor device such as a CPU or a GPU. The processor is configured by a device or a circuit capable of performing a predetermined operation. A process is not limited to a software program process and can also be implemented with a dedicated circuit. An FPGA, an ASIC, or the like can be applied as the dedicated circuit. The program may be installed in advance as data in a target computer or may be distributed and installed as data from a program source to a target computer. The program source may be a program distribution server on a communication network or may be a non-transitory computer-readable recording medium. The program may be configured by a plurality of program modules. The computer system may be configured by a plurality of computers. The computer system may be configured as a client server system, a cloud computing system, an IoT system, or the like. To facilitate description, data or information for identifying various elements are described with expressions such as identification information, identifiers, IDs, names, or numbers, but such expressions can be replaced one another.

[Problem and the Like]

A problem or the like will be supplementarily described. When a semiconductor device is manufactured, an exposure device is used to repeat exposure a plurality of times in a plurality of different regions in a wafer and it is general to repeatedly form the same circuit pattern on the surface of one wafer, for example, a plurality of chip regions. A single exposure or a region formed by the exposure is called a shot in some cases. In a shot, one or more unit regions (referred to as pattern-formed unit regions) equivalent to the same circuit pattern of a chip (in other words, a die) are included. The adjacent dies are separated by a scribe line. In the scribe line, for example, a performance evaluation circuit called TEG is disposed. In a chip region, a plurality of smaller circuit patterns are also included in some cases. On the surface of the wafer, the pattern-formed unit region including an element such as a die or a scribe line is formed in a period of the shot. The period is a special distance or interval in each in-plane direction.

In an observation device such as a review SEM, information for alignment (in other words, position correction) (which is referred to as alignment information) is registered as part of a recipe. For the alignment information, reference position coordinates for imaging of a template pattern image, a plurality of position coordinates for imaging of a plurality of test pattern images, or the like are registered. When the same position coordinates in a shot are selected as a plurality of position coordinates in the alignment information, it is preferable that the same circuit pattern can be obtained as an SEM image in a plurality of observation or inspection images of an alignment result.

However, when a user registers a plurality of position coordinates, it is difficult to select appropriate position coordinates with high accuracy in some cases. For example, when a configuration of a shot, a chip, or the like on the surface of a wafer is unclear at the time of observation, for example, no design information is included in some cases or external design information cannot be referred to in some cases. In these cases, it may be difficult to set appropriate position coordinates or an effort is considerable although the appropriate position coordinates can be set.

In particular, in a system related to manufacturing, measurement, inspection, and the like of a semiconductor device, it is desirable to select appropriate alignment position coordinates based on a repeated formation period of a circuit pattern at the time of alignment of a wafer. However, in order to select appropriate alignment position coordinates, it is necessary to select the alignment position coordinates based on a shot region or the like of exposure. In the technology of the related art, such a viewpoint has not been considered, a work procedure for generating a recipe including setting of alignment information by a user is complicated, and the number of processes is large.

As described above, simplicity or the like of generation of a recipe is an important performance index of the review SEM, but complicated setting of the alignment is a big problem. Accordingly, as an objective, it is necessary for a user to set information such as a plurality of observation position coordinates or the like easily and accurate as high as possible in consideration of accuracy of alignment and a period of a shot or the like when the recipe including alignment information is generated and set. Embodiments provide technologies for attaining the objective.

First Embodiment

A computer system and the like of an observation device according to a first embodiment of the present disclosure will be described with reference to FIGS. 1 to 13. The computer system according to the first embodiment is a computer system in which an observation device or a system (for example, an observation system or an inspection system of a semiconductor device) including the observation device is included as a constituent element. A processing method according to the first embodiment is a method including steps of generating information for observing a sample (a recipe to be described below) on the computer system according to the first embodiment.

[Overview]

The computer system of the observation device according to the first embodiment specifies a period of a pattern-formed unit region of a shot, a chip, or the like using a scheme such as pattern matching, for example, a scheme of evaluating similarity between images, from a plurality of images (referred to as determination images in some cases) captured at a plurality of points in a sample. This system specifies a region of a shot, a chip, or the like based on the specified period, determines appropriate observation or inspection alignment information, and generates and outputs a recipe including the alignment information. In other words, the alignment information is information regarding position coordinates for position correction on the surface of a sample.

The embodiments are examples applied to a semiconductor observation device or a semiconductor inspection device, but can also be similarly applied to other kinds of devices in which alignment or the like for a sample is necessary.

In the embodiments, a period which is a specifying target indicates a distance or an interval of disposition of a repeatedly formed pattern-formed unit region such as a circuit pattern on the surface of a sample such as a wafer in a space.

In the embodiments, the alignment indicates setting or correction of a position of a sample with respect to a position, a field of view, or the like of an observation unit (specifically, an SEM or an optical microscope) in observation or inspection of the sample such as a wafer. The alignment position indicates position coordinates (a chip as a specific example) for alignments on the surface of a sample. The recipe is information including the alignment position, an imaging condition, and the like set at the time of inspection of the sample. The imaging condition includes, for example, the number, positions, sizes, brightness, and timings of images captured for inspection.

[Observation Device and Observation System]

FIG. 1 is a diagram illustrating a configuration of an observation system including a computer system of an observation device according to the first embodiment. The observation system includes an observation device 1, and a storage device 106, a display device 107, and an input device 108 connected as external devices to the observation device 1. The observation device 1 is an observation device targeting a semiconductor device and is a device that has at least an observation function. The observation device 1 may be further an inspection device that has an inspection function targeting a semiconductor device. An observation system or an inspection system related to a semiconductor device overall includes the observation device 1 as a main constituent element. A user U1 is an operator that performs work related to observation or inspection using the observation system. The user U1 operates and uses this system with the input device 108 or the display device 107 connected to the computer system 2.

The observation device 1 includes a general control unit 105 according to the computer system 10, a stage control unit 104, and an observation unit 103 and a stage 102 mounted inside a casing 100. The casing 100 is, for example, a mechanism including a vacuum chamber. Each unit such as the stage control unit 104 may be mounted as, for example, a circuit such as an FPGA or a computer.

To facilitate description, directions or a coordinate system (X, Y, Z) to be illustrated are used in some cases. The X and Y directions are two directions perpendicular to each other to form a horizontal plane and correspond to a radial direction of a sample 101 or the like. The Z direction is a vertical direction orthogonal to the X and Y directions and corresponds to a height direction of the sample 101 or the like.

The observation unit 103 (in other words, a sample observation unit or an imaging unit) is a mechanism that images the sample 101 on the stage 102 or observes it in accordance with another detection method. As a mounting example of the first embodiment, the observation unit 103 is an SEM. The present disclosure is not limited thereto. In another mounting example, an optical microscope or the like can be applied as the observation unit 103. In still another mounting example, the observation device 1 including the observation unit 103 may be a device that includes both an optical microscope and an SEM. In this case, observation can be performed using functions of both the optical microscope and the SEM or a function of the selected one.

The general control unit 105 is mounted in the computer system 2. According to the first embodiment, the general control unit 105 according to the computer system 2 realizes a distinctive function mainly based on software program processing. This function is a function of specifying a period of a pattern-formed unit region using an image (a signal A2) input and acquired from the observation unit 103, generating a recipe (a signal B2) including an observation or inspection alignment position using the specified period, and automatically setting and instructing the observation unit 103.

In FIG. 1, as an example of a signal or data, the signal A1 is a signal that is given from the computer system 2 to the observation unit 103 and makes an instruction to capture a determination image. The signal A2 is a determination image that is given from the observation unit 103 to the computer system 2 as a result of being imaged by the observation unit 103 based on the signal A1. A signal B1 is a signal (for example, recipe setting information) of the recipe including the observation or inspection alignment information given from the computer system 2 to the observation unit 103. The signal B2 is an observation or inspection image that is given from the observation unit 103 to the computer system 2 as a result of being imaged by the observation unit 103 based on the recipe of the signal B1.

Each signal is transmitted and received through a predetermined communication interface or a signal or data format.

The storage device 106 is, for example, a storage device or a DB server and retains various kinds of data. The display device 107 is, for example, a liquid crystal display or the like and displays a video including a GUI related to work on a display screen. The input device 108 is, for example, a mouse or a keyboard and receives an input operation by the user U1. The computer system 2 includes an interface connecting these devices to each other. The devices such as the storage device 106, the display device 107, and the input device 108 may be mounted as part of the computer system 2.

A communication network 120 such as a LAN can be connected to the computer system 2 via a communication interface. The computer system 2 may communicate with another device on the communication network 120, for example, a server or another inspection device and may perform referring or acquisition of information from the outside, writing of information to the outside, or the like. Examples of the communication include referring to design information or relevant information of a semiconductor device, referring of inspection information (for example, defect position information or observation target position information) from another inspection device, and supply of observation or inspection result data to another device.

A characteristics function in the embodiment can also be realized by only a part of the computer system 2 including the general control unit 105. In this case, the computer system 2 inputs and acquires data such as an image in accordance with, for example, any method such as communication from the observation device 1 including the observation unit 103. The computer system 2 performs a process similar to that of the first embodiment to generate a recipe using the data. The computer system 2 outputs the data such as the recipe and gives the data to the observation device 1, for example, in accordance with any method such as communication.

Stage position coordinates (or sample position coordinates) are a position (for example, X101) of the sample 101 on the stage 102 with respect to a position (for example, X103) of the observation unit 103 in the coordinate system (X, Y, Z) of the casing 100 in FIG. 1. As a modified example, the observation unit 103 may be configured to be movable. The alignment is appropriate setting or correction of a relative positional relation between the observation unit 103 and the sample 101 on the stage 102. Therefore, one of the observation unit 103 and the stage 102 may be moved for adjustment. Alternatively, the fixed observation unit 103 suffices in the case of a mechanism that can move a charged particle beam or a radiation position of light with respect to the surface of the sample 101. In this case, the general control unit 105 realizes the alignment by driving and controlling movement or radiation of the observation unit 103 in addition to the control of the movement of the stage 102 based on the alignment information.

[System (2)]

The sample 101 which is an observation target in FIG. 1 is a semiconductor wafer and is placed on the stage 102 which can be moved in the X and Y direction to be observed using the observation unit 103. The stage 102 moves the stage 102 so that an observation target region of the surface of the sample 101 is entered within a field of view 110 of the observation unit 103 based on an instruction signal from the stage control unit 104 under the control of the general control unit 105. A position of the sample 101 controlled by moving the stage 102 is described as stage position coordinates in some cases.

The observation unit 103 acquires an image (the determination image (A2) or the observation image (B2)) of the sample 101 based on the signal (A1 or B1) from the general control unit 105. The general control unit 105 can display information including the image acquired from the observation unit 103 on the display screen of the display device 107 along with a GUI. The user U1 can input an instruction, setting information, or the like to the general control unit 105 through an operation of the input device 108 while viewing the display information of the display device 107.

The general control unit 105 outputs a control instruction or the like to the observation unit 103 or the stage control unit 104 to control each unit based on the recipe (B1) which is the consecutive imaging program input by the user U1 and generated and recorded in advance. The recipe can be substantially automatically generated using the input information by the general control unit 105 using part of input information through the input device 108 by the user or from the outside and also receives correction by the user U1.

[SEM]

An exemplary configuration of the SEM which is an example of the observation device 1 or the observation unit 103 is as follows. Only an overview will be described simply because of a known technology. The SEM is a kind of charged particle beam device. The SEM includes the observation unit 103 configured by an electronic optics system disposed in a vacuum chamber. The electronic optics system includes an electronic source, a polarizer, an electronic lens, and a detector. The detector is a secondary electron detector that includes a plurality of 2-dimensionally arrayed elements (equivalent to pixels) and a signal output from the detector is equivalent to an image.

A beam which is a primary charged particle beam emitted from the electronic source under control is polarized by the polarizer, is converged by the electronic lens, and is radiated to the surface of the sample 101 on the stage 102. The beam can be scanned in the X or Y direction. When the beam is radiated to the surface of the sample 101, secondary electrons are emitted as secondary charged particles from the surface of the sample 101. The detector detects the secondary charges or the like as a detection signal.

In the vacuum chamber of the casing 100, the stage 102 is provided. The stage 102 is driven based on driving control of the stage control unit 104 and can be moved in at least the X and Y directions in the illustrated coordinate system (X, Y, Z). The stage 102 may be movable in the Z direction or may be rotatable around an axis in the Z direction. The sample 101 is installed and retained on the top surface of the stage 102 by a mechanism (not illustrated). The sample 101 is, for example, a semiconductor wafer. The sample 101 is disposed at a desired position (stage position coordinates) in the coordinate system (X, Y, Z) with movement of the stage 102. In FIG. 1, a position of the observation unit 103 in the X direction is indicated as a fixed or reference position by a position X103 of a one-dot chain line. A position of the sample 101 and the stage 102 in the X direction, in particular, a central position of a circular wafer, is indicated by a position X101 of a one-dot chain line. The stage position coordinates are the position of the sample 101 and the stage 102 when the position X103 (the same applies in the Y direction) is a reference in the coordinate system (X, Y, Z). The field of view 110 indicates a concept of a field of view related to an image region on an X-Y plane when an image is captured and acquired by the mechanism of the observation unit 103.

The general control unit 105 of the computer system 2 includes a mechanism such as a circuit or a program that processes a signal or an image from the observation device 1 (in particular, the observation unit 103). In this example, the general control unit 105 realizes a characteristic function, that is, a function of generating the recipe including the alignment information, mainly based on the software program processing. This function is a function of generating the recipe most automatically with a minimum effort of a user operation. This function also provides a graphical user interface (GUI) to be described below. Input or output information or data related to the function can be checked on the display screen of the display device 107 by the user U1, and thus user setting or the like is also possible.

[Computer System]

FIG. 2 is a diagram illustrating an exemplary configuration of the computer system 2. The computer system 2 includes the computer 200, and the input device 108, the display device 107, or the like in FIG. 1 connected to the computer 200. The computer 200 includes a processor 201, a memory 202, a communication interface device 203, an input/output interface device 204, and a bus connecting them one another. The input device 108 or the display device 107 is connected to the input/output interface device 204. The communication interface device 203 performs communication with the communication network 120 in FIG. 1.

The processor 201 includes, for example, a CPU, a ROM, and a RAM and configures a controller of the computer system 2. The processor 201 realizes a function or a processing unit of the computer system 2 based on the software program processing based on the control program D1. The function includes a function of generating the recipe including the alignment information.

The memory 202 is configured by a nonvolatile storage device or the like and stores various kinds of data or information used by the processor 201 or the like. The memory 202 stores the control program D1, the setting information D2, and data (D3 to D4) corresponding to the signals (A1, A2, B1, and B2) in FIG. 1. The processor 201 stores each piece of data which is being processed in the memory 202. The control program D1 is a program that realizes a function. The setting information D2 is setting information of the control program D1 or user setting information by the user U1. The setting information D1 may include a control threshold.

[Sample]

FIG. 3 is a diagram illustrating an exemplary configuration of a wafer top surface 301 which is the sample 101. On the wafer top surface 301, a position 300 is a central point of a circular wafer. Any reference position coordinates (x0, y0) can be set arbitrarily in the surface of the wafer. The example of an enlarged diagram in the lower part shows a case when a position J1 is set as the reference position coordinates (x0, y0). The reference position coordinates (x0, y0) are a position at which a reference image to be described below is captured.

Any size of the determination image captured to specify a period of the pattern-formed unit region can be used. In the first embodiment or the like, a relatively small size is assumed. The size is smaller than a chip size, for example, as illustrated in an enlarged portion of the illustration. The size of an image is indicated by the number of pixels in the X and Y directions. As an example of the size relation, a diameter of the wafer region is 300 mm, the size of a shot region is tens of mm, the size of a chip region is several mm, and a size of the determination image is about several μm.

In the region of the wafer top surface 301, a chip 302 (a corresponding chip partition line) and a shot 303 (a corresponding shot partition line) are formed excluding the vicinity of a circular outer circumference. An example of the region of the shot 303 is indicated by shading. One shot 303 includes, for example, 9 (3×3) chips 302. Each size of one chip 302 in the X and Y directions is indicated by a chip size 312 (sx, sy). Each size of one shot 303 in the X and Y directions is indicated by a shot size 313 (Sx, Sy). A period at which the plurality of chips 302 are repeatedly formed in the X and Y directions is indicated by a chip period 322 (cx, cy). A period at which the plurality of shots 303 are repeatedly formed in the X and Y directions is indicted by a shot period 323 (Cx, Cy). In the example of the first embodiment, a specified target is the shot period 323 (Cx, Cy).

The shot size 313 (Sx, Sy) of the shot 303 and the shot period 323 (Cx, Cy) can be defined from the chip size 312 (sx, sy) and a period (cyc_out_x, cyc_out_y) related to the chip. The period (cyc_out_x, cyc_out_y) related to a chip is a repetition number (a distance converted into the number of chips) at the chip period 322 (cx, cy).

The shot period 323 (Cx, Cy) can be calculated using the chip size 312 (sx, sy) and the period (cyc_out_x, cyc_out_y) by multiplication as in the following Expression 1. The period (cyc_out_x, cyc_out_y) is a parameter used for a calculation processing method to be described below for calculation of the shot period 323 (Cx, Cy) and is different from the chip period 322 (cx, cy).

$$Cx=(sx)\times(cyc\_out\_x)$$

$$Cy=(sy)\times(cyc\_out\_y) \qquad \text{Expression 1:}$$

As an example of a plurality of position coordinates and regions corresponding to the plurality of determination images, a first region R1 of the first position J1, a second region R2 of the second position J2, . . . or the like are indicated. The number of cases in which the plurality of determination images are captured is an imaging number N.

On the surface of the wafer, there is a repeatedly formed unit region called an exposure shot in an exposure process in manufacturing. The shot 303 corresponding to the exposure shot includes a plurality of chips 302 (also called dies) as regions with a smaller size. Either the chip 302 or the shot 303 is an example of the pattern-formed unit region. In the first embodiment, the shot period 323 is specified as a target, but the chip period 322 or the like is also specified in relation to the specification. The target in the specifying of the period of the pattern-formed unit region from the image is not limited to the shot or the chip.

On the surface of the wafer, an alignment pattern is formed in advance in some cases and is not formed in some cases. In any case, the function of the present disclosure can be applied.

Positions 351 indicate examples of a plurality of registration position coordinates when a plurality of determination images are captured. Examples of the positions 351 (J1, J2, . . . ) are disposed at a predetermined distance 352 without considering the chip size 312 or the like. A rectangle at the position 351 is an example of the size of a captured image region.

When the chip size 312 is known, more efficient determination can be made by setting an imaging position or distance of the plurality of determination images in consideration of the value. When the chip size 312 is not known and a plurality of positions or distances are variously tried, at least final determination is necessarily possible.

[Semiconductor Device]

In the most advanced semiconductor manufacturing, a pattern with dimensions of several nm is repeatedly formed on, for example, a wafer of 300 mm. Observation or inspection targets are many defects or foreign matters of several nm in the wafer. Therefore, in an observation device or an inspection device that performs acquisition of foreign matters or defects on the SEM, analysis such as EDS analysis, acquisition of defect position coordinates used for the analysis, and the like, high position accuracy is necessary. Since there is a limitation on guarantee of position accuracy of a mechanical mechanism, alignment is generally performed using a semiconductor pattern or a known defect. In the alignment, for example, a correction value from a detection position of a template image is calculated by correlation calculation between a template image registered in advance in a recipe and each image acquired at each position coordinates registered in the recipe. On a semiconductor device, it is general to repeatedly form a single exposure pattern (the shot 303 in FIG. 3) in many cases. Accordingly, at the same position (for example, the position 331 in FIG. 3) in each exposure shot region, it is guaranteed that there is the same pattern. Therefore, it is desirable to register alignment position coordinates based on the shot. In the scheme according to the first embodiment, based on inputting and setting of the chip size 312 and the reference position coordinates (x0, y0) distinctive to the shot 303, the shot period 323 is specified and the alignment position coordinates are determined substantially automatically.

[Processing Flow (1)]

FIG. 4 is a flowchart illustrating a main process in the computer system 2 according to the first embodiment. The flowchart has steps S101 to S116. In step S101, the computer system 2 inputs and sets the reference position coordinates (x0, y0) and the chip size 312 (sx, sy) as setting information based on inputting or the like by the user U1. Besides, the imaging number N or the like is input and set as setting information. The setting information can be input through any of destination by the user U1 with the input device 108, using of a setting value stored in advance, referring from an external device, and the like or a combination thereof.

The reference position coordinates (x0, y0) are a position serving as a reference for searching a size or a period of the shot, in other words, an imaging start position, and is a first position for capturing a plurality of determination images (a reference image and a test image). The reference position coordinates (x0, y0) are reference position coordinates distinctive to the shot 303. The imaging number N is a number in which a plurality of test images gi are captured at a plurality of registration position coordinates. The imaging number N is assumed to be Nx in the X direction and Ny in the Y direction. The number of a plurality of determination images is a sum (N+1) of one reference image gt and N test images gi. Of the plurality of determination images, images except for the reference image gt (in other words, comparison target images with the reference image) are referred to as the test images gi.

In this example, it is assumed that the chip size 312 in FIG. 3 is known in advance in terms of design and the chip size 312 can be referred to as a design value, for example, for the user U1 or the computer system 2. Therefore, in step S101, the chip size 312 is input as one of the setting information. The computer system 2 performs efficient determination in consideration of the chip size 312.

In the scheme according to the first embodiment, based on the input information and based on pattern matching between the determination images, that is, the reference image and each test image, the period (cyc_out_x, cyc_out_y) related to the repeated formation of the chip 302 is specified from similarity between the images, and the shot period 323 (Cx, Cy) is specified from the period (cyc_out) and the chip size 312 as in the above Expression 1. In this scheme, based on the shot period 323 (Cx, Cy), an alignment chip is determined as the alignment information (to be described below).

As a modified example, when the chip size 312 is unknown, this scheme can be similarly applied. In a process similar to that of the flowchart, the chip size 312 can be estimated and specified.

A portion from step S102 to step S112 is a portion in which the period (cyc_out_x) in the X direction is calculated. Step S114 is a portion in which the period (cyc_cout_x) in the Y direction is calculated through a process similar to the process in the X direction. Description thereof will be omitted because of being similar.

In step S102, the computer system 2 moves the stage 102 (corresponding stage position coordinates) to the input reference position coordinates (x0, y0). After the movement, in step S103, the computer system 2 causes the observation unit 103 to image the pattern on the wafer at the reference position coordinates (x0, y0) which is a first position (FIG. 5) and acquires a reference image (which is denoted by gt and corresponds to a template image) as a first image. The reference image gt is also one of the determination images. In step S104, the computer system 2 sets the number i (an image number) of test images gi which is a processing variable to 0 as an initial value and sets imaging position coordinates (x, y) of the test image gi which is a processing variable to (0, 0) as an initial value.

In steps S105 to S110, the computer system 2 acquires the plurality of test images gi captured at a plurality of positions on the surface of the wafer which is the sample 101.

[Plurality of Determination Images]

FIG. 5 is a schematic diagram illustrating a plurality of acquired determination images (the reference image gt and the test images gi) captured at a plurality of positions on the surface of the wafer which is the sample 101. Positions J1 to J4 in the X direction are illustrated as examples of imaging locations (in other words, imaging positions) J. At the first position J1 which is the reference position coordinates (x0, y0), a region R1 with a corresponding designated size is targeted and the reference image gt is captured as a first image 501. At the second position J2 progressed by a predetermined distance, for example, to the right from the reference position coordinates (x0, y0), a region R2 with the same size is targeted and a first test image g1 is captured as a second image 502. Similarly, at the third position J3 progressed by the predetermined distance from the second position J2, a region R3 with the same size is targeted and a second test image g2 is captured as a third image 503. At the fourth position J4 progressed by the predetermined distance from the third position J3, a region R4 with the same size is targeted and a third test image g3 is captured as a fourth image 504. Similarly, each image is captured at each position. At a final position $J_{N+1}$ corresponding to the imaging number N (Nx), a region $R_{N+1}$ is targeted and an n-th test image gN is captured as an N-th image. In this way, I=1 to Nx is satisfied and the plurality (Nx) of test images (g1, gN) are acquired in the X direction.

In this example, the determination images are distant, but the images may come into contact with each other or may overlap partially in accordance with setting of the registration position coordinates.

In the lower part of FIG. 5, the images 501 to 504 which are examples of the images (gt and g1 to g3) captured in the imaging locations (the positions J1 to J4) are illustrated. When the determination images are captured, an accurate positional relation between the imaging positions and the chips 302 or the shots 303 is unclear. Therefore, as in the illustrated example, there is a difference in content of each determination image. For example, the location inside the chip 302 is not necessarily the same. This example shows a case in which a pattern such as a crossroad (which is a pattern smaller than a chip) is shown in each image.

[Processing Flow (2)]

FIG. 4 is referred to back. Subsequently, the computer system 2 acquires the test image gi captured at each position (Ji) in step S105 and calculates similarity sim(i) between the reference image gt and the test image gi in step S106. When the number i is less than the imaging point N (Nx) in step S107 (N: No), the computer system 2 causes the process to proceed to step S108. When the number i reaches the imaging point N in step S107 (Y: Yes), the process proceeds to step S111.

In step S108, the computer system 2 increases the value i to (i+1). In step S109, the variable x is calculated with x=x0+I×sx (Expression A). In step S110, the computer system 2 moves the stage 102 to position coordinates (x, y0). Thereafter, the process returns to step S105 and the same process is repeated. In this example, the imaging number N is a previous setting value or an input value in step S101.

In the example of FIG. 5, it is known that similarity between the first image 501 which is the reference image gt and the fourth image 504 is relatively high and similarity between the first image 501 and the second image 502 is relatively low. That is, similarity sim(1) with the second image 502 (the first test image g1) calculated in step S106 is a relatively small value and similarity sim(3) with the fourth image 504 (the third test image g3) is a relatively large value.

[Similarity]

FIG. 6 is a diagram illustrating an example of the similarity sim(i) between the reference image gt and each test image gi corresponding to the examples of the images 501 to 504 in FIG. 5. In the graph of FIG. 6, the horizontal axis represents an image number (i) and the vertical axis represents the similarity sim(i). In the flowchart of FIG. 4, a pattern (corresponding image content) with similarity familiar at a period in an i direction as a matching result as in FIG. 6 appears in the plurality of images obtained as a result of the imaging (step S105 or the like). For example, similarity considerably close at a period appears periodically. That is, in the test image gi acquired by imaging a position or a region in which the same circuit pattern as the circuit pattern in the reference image gt (the first image 501) is formed, the similarity sim(i) has a considerably close value compared to the other test images in which other patterns are formed. For example, because of the reference image gt at i=0, the similarity is a maximum value. At i=3, the similarity is a large value close to the maximum value as in the fourth image 504 (the third test image g3) in FIG. 5. In this scheme, the period of the pattern-formed unit region (for example, the shot 303) can be specified from periodicity of the similarity of this pattern. From the result of the similarity, it can be assumed that, for example, the same pattern appears at the period (the corresponding distance 513 in FIG. 5) corresponding to i=3 in the X direction. When it can be checked that a pattern with sufficiently high similarity appears at locations of multiples (3, 6, 9, 12, . . . ) of the assumed period, it can be determined that the assumed period is a period of the pattern-formed unit region. Steps S111 and S112 are processing examples in terms of this viewpoint.

[Processing Flow (3)]

FIG. 4 is referred to back. Subsequently, in the process from step S111, the computer system 2 determines periodicity of the similarity sim(i). In step S111, the computer system 2 extracts the similarity sim(i) equal to or greater than a threshold hsim with respect to the similarity sim(i) of each of the calculated test images gi, sets the similarity sim(i) equal to or greater than threshold hsim as candidate similarity simc as a variable in terms of the process, and sets the number i (the number or the image number) corresponding to the candidate similarity simc as a candidate number ic.

In step S112, the computer system 2 specifies a period (assumed period) including all the multiples equal to or less than the imaging number N(Nx) in the candidate number ic as the period cyc_out_x related to the chip 302.

[Period]

FIG. 7 is a schematic diagram illustrating a processing method of steps S111 and S112. In the graph of FIG. 7, the horizontal axis represents the similarity sim(i) and the vertical axis represents a frequency value. In this example, for similarity sim(i), there are three values A, B, and C as approximately same values. The value C corresponds to the large similarity sim(i) as in i=3 and 6 in FIG. 6. The computer system 2 sets the processing threshold hsim. The computer system 2 compares a value of each similarity sim(i) with the threshold hsim and sets a value equal to or greater than the threshold hsim as the candidate similarity simc. In this example, one value C becomes one candidate similarity simc. Depending on an instance, the plurality of similarities sim(i) equal to or greater than the threshold hsim occur as the plurality of candidate similarities simc in some cases. The same is established in these cases. In this example, the frequency value of the similarity is not directly used.

The computer system 2 can estimate that the pattern inside the test image gi in the candidate number is in which the closest candidate similarity simc can be obtained is the same as the pattern inside the reference image gt.

The threshold hsim may be a previous constant setting value, but may be automatically set as a variable setting value in accordance with the following method. In this case, the number of processes of generating a recipe can be further reduced. The computer system 2 calculates an evaluation value Eh with regard to the threshold hsim in which the similarity sim(i) is separated into two classes with the following Expression B. The evaluation value Eh can be obtained by dividing a dispersion $\sigma_b^2$ between the classes of the similarity sim(i) by a dispersion $\sigma_w^2$ in the class. This method is a method of determining a threshold (a candidate threshold) in which the calculated evaluation value Eh is the maximum or largest as the threshold hsim.

In Expression B, $\omega_1$ is the number of pieces of data in the class equal to or greater than the candidate threshold and ($0_2$ is the number of pieces of data in the classes less than the candidate threshold. $m_1$ is an average value in the class equal to or greater than the candidate threshold, and $m_2$ is an average value in the class less than the candidate threshold. $\sigma_1^2$ is a dispersion in the class equal to or greater than the candidate threshold and $\sigma_2^2$ is a dispersion in the class less than the candidate threshold.

$$\sigma_b^2 = \Phi_1 \omega_2 (m_1 - m_1)^2 / (m_1 + m_1)^2$$

$$\sigma_w^2 = \omega_1 \sigma_1^2 + \omega_2 \sigma_2^2 / \omega_1 \omega_2$$

$$Eh = \sigma_b^2 / \sigma_w^2 \qquad \text{Expression B:}$$

In step S112, the period (cyc_out) is determined from a value included in the candidate number ic. For example, in the case of a wafer in which there are three chips 302 in the shot 303 in the X and Y directions as in FIG. 3, the reference point (that is, the same pattern) appears at position coordinates by an interval of three chips as the period. Therefore, the candidate number ic includes 3, 6, 9, 12, and the like which are multiples of 3. The three chips are equivalent to the period (cyc_out_x, cyc_out_y) related to the chips 302 which are to be obtained. In this example, when the shot period 313 (Sx, Sy) in FIG. 3 is obtained, as described above, the chip size 312 and the period (cyc_out_x, cyc_out_y) are used. In terms of the process, the period assumed as a candidate is described as a candidate period. This period is a unit in which a distance is converted into the number of chips. In terms of design, since the number of chips which is an integer equal to or greater than 2 in each direction is included in one shot, the candidate period is an integer (2, 3, 4, 5, . . . ) equal to or greater than 2.

In step S112, the computer system 2 determines that the period (the candidate period) at all the multiples equal to or less than the imaging number N(Nx) are included in the candidate number ic is the period (cyc_out_x) related to the chips. A specific processing example is as follows. For example, the imaging number N=18 is set. The computer system 2 performs the determination in order from a smaller value of the candidate period. First, the candidate period=2 is set. In this case, multiples of the candidate period equal to or less than the imaging number N are 2, 4, 6, 8, . . . , 18. The computer system 2 determines whether all of the multiples are included in the candidate number ic of the candidate similarity simc. In the example of FIG. 6 or the like, all of the multiples are not included. When all of the multiples are not included, the computer system 2 performs the determination by targeting multiples (3, 6, 9, . . . , 18) of 3 which is a following number. In the example of FIG. 6 or the like, it is assumed that all of the multiples of 3 are included in the candidate number ic. In this case, at that time point, the computer system 2 determines that the candidate period=3 (a distance corresponding to three chips) is the period (cyc_out_x) related to the chips.

There is a concern of a variation in the similarity of the image occurring due to a property or the like of the image. Therefore, as a modified example, the following may be realized. In the modified example, in the determination of the period (cyc_out_x, cyc_out_y) related to the chip 302, a voting system is used in consideration of values included and values not included in the candidate number ic at each candidate period. In other words, in a processing method of the modified example, although all of the multiples of the candidate period are not included in the candidate number ic, a value in which the degree of inclusion is overall the highest is determined to be the period (cyc_out). For example, when multiple values are included in the candidate number ic at each candidate period, the computer system 2 sets an evaluation value of the candidate period to +1. When the multiple values are not included, the computer system 2 sets the valuation value to −1. In this way, the evaluation values of the candidate periods are aggregated. The computer system 2 determines that the candidate period with the highest evaluation value is the period (cyc_out). For example, in an instance of the shot 303 that has the period (cyc_out) corresponding to three chips in FIG. 3, the multiples of 3 are not included in the many candidate numbers ic. Therefore, the evaluation value becomes positive. Since numbers 1, 2, 4, 5, 7, 8, 10, and the like except for the multiples of 3 are not included in the candidate number ic, the evaluation value becomes negative.

[Processing Flow (4)]

FIG. 4 is referred to back. In step S113, the computer system 2 moves the stage 102 to the reference position coordinates (x0, y0). In step S114, the computer system 2 determines the period (cyc_out_y) related to the chip 302 in the Y direction, as in the process in the X direction.

As a modified example, the determination of the periodicity of the similarity sim(i) in the X direction in steps S102 to S110 and the determination of the periodicity of the similarity sim(i) in the Y direction in step S114 may be performed in parallel. Then, based on the period determination results, an appropriate value of the imaging number N may be determined as a variable value.

In the first embodiment, the plurality of determination images are acquired, and the imaging at each position and the movement of the distance to the degree matched to the known chip size 312 (the distance between the imaging locations in FIG. 3 or 5) are repeated as in the example of the plurality of registration position coordinates and the plurality of test images in FIG. 5. The present disclosure is not limited thereto. The processing method may be performed as long as the periodicity based on the calculation of the similarity between the images can be determined. The distance of the movement (the distance between the determination images) may not necessarily be the chip size 312. The imaging of the determination images may be performed during movement of the stage 102 without being limited to the stop of the stage 102. In other words, the movement and the imaging may be concurrently performed.

Subsequently, in step S115, the computer system 2 specifies the shot period 323 (Cx, Cy) of FIG. 3 using the information such as the period (cyc_out_x, cyc_out_y) related to the chip 302 obtained as described above, and the alignment chip which is the chip 302 equivalent to the alignment position is automatically selected and determined using the shot period 323 (Cx, Cy). The shot period 323 (Cx, Cy) can be calculated with Expression 1 from the chip size 312 (sx, sy) and the period (cyc_out_x, cyc_out_y), as described above.

[Alignment]

FIG. 8 is a diagram illustrating alignment. FIG. 8 illustrates an example in which four chips 302 at specific positions are selected as alignment chips 800 (801 to 804) on the surface of the wafer which is the sample 101 similar to that of FIG. 3. The alignment chips 800 (801 to 804) are indicated by shading. A black thick line indicates separation of the shot 303 and a thin line indicates separation of the chip 302. The separation of the shot 303 can be estimated from the shot period 323 (Cx, Cy) based on the period (cyc_out_x, cyc_out_y).

The computer system 2 selects a plurality (four) of alignment chips 800 by a predetermined rule. For appropriate alignment, at least three alignment position coordinates are necessary. In this example, four alignment chips 800 (801 to 804) are selected. The number of selected alignment chips is a setting value.

In this example, the following rules can be exemplified. As a first rule, a chip closest to the outer circumference in a radial direction is selected in a circular region on the surface of the wafer. As a second rule, in a plurality of chips selected from a chip group located at a position close to the outer circumference, an inter-chip distance is as large as possible. As a third rule, the chips at the same position within each shot region are selected.

For the first rule, in this example, the shots 303 located at the upper, lower, right, and left ends (corresponding sides) in the X and Y directions which are the radial direction of the surface of the wafer first become candidates. In this example, there are twelve illustrated shots 303 in the outer circumference. For example, as indicated in a dotted range, there are three shots 303a, 303b, and 303c on the upper side. Of the three shots 303a, 303b, and 303c, for example, the middle shot 303b is selected. In this example, the shot 303b on the X and Y axes is selected with respect to a central position 300.

For the second rule, four shots are selected so that an inter-shot distance or an inter-chip distance (for example, an inter-chip distance 820) is the largest with respect to the four shots 303 which are the candidates. In this case, the shots 303 located at the middle of the upper, lower, right, and left sides are selected.

For the third rule, of nine (3×3) chips 302 in four shots 303 (for example, the central shots 303b at the middle of the upper end), the chips 302 at the same positions are selected as candidates. In this example, the central chips 302 of the shots 303 are selected.

As a result, four illustrated chips 302 are selected as the alignment chips 800 (801 to 804). A processing method of determining the chips by the third rule prior to the second rule may be used.

The inter-shot distance or the inter-chip distance is a distance between two shots or chips when two closest shots or chips are viewed among the four shots or chips selected as the candidates. For example, an inter-chip distance 820 or the like between the chip in the shot at the illustrated upper end and the chip in the shot at the right end is used. The present disclosure is not limited to this example. For example, the illustrated chip 810 indicates an example in which a position in the shot 303 to the right circumference is selected rather than the center in the group of the shots 303 in the outer circumference.

For the first rule, when the position of an outer circumferential set in the radial direction is selected, there is the advantageous effect that alignment accuracy can be improved further than when the position of an inner circumferential set in the radial direction is selected. Conversely, in the case of the position of the outer circumferential set in the radial direction, there is a disadvantageous effect that an influence of foreign matters, charging, or rotation at the time of placement of the wafer is easily given. In the case of the position of the inner circumferential set in the radial direction, there is an advantageous effect that this influence is not easily given. Accordingly, in consideration of these, it is possible to determine whether to select the position of the outer circumferential set or the position of the inner circumferential set in the radial direction as the first rule. The chip 830 indicates an example of a case in which the position of the inner circumferential set is selected as the alignment chips.

In a program of the computer system 2, the foregoing rules are set in advance, and thus the optimum chips 302 are automatically selected as the alignment chips 800. As a modified example, the rules may not be fixed but set to be variable and the rules may be designated in accordance with input or setting by the user U1. For example, for the first rule, the user U1 is allowed to designate a rule for selecting the position of the outer circumferential set in the radial direction and a rule for selecting position of the inner circumferential set. Similarly, for the third rule, the user U1 is allowed to designate the positions of the chips selected in the shot region.

In this way, by allowing the user U1 to select or designate a rule for the alignment chips or a determination method therefor in consideration of restrictions or the like of shot disposition in the wafer, it is possible to stabilize an alignment operation. An example of a GUI related to this function will be described below.

In the first embodiment, the scheme of using a specific result of the size or the period of the shot 303 as an example, as described above, for the automatic selection of the alignment chips corresponding to the alignment positions based on the matching between the images and the determination of the periodicity has been described. The present disclosure is not limited to the shots 303. The same scheme can be used to specify a size and a period in another pattern-formed unit region (for example, the chip 302 or a pattern in the chip 302) and a recipe including alignment information can be determined using the size and the period.

Further, the computer system 2 may set a size and a period of a specific pattern-formed unit region (for example, a shot) in a manufactured semiconductor device based on estimation of the foregoing scheme as a measured value or an actual value, perform comparison with a design value of the size and the period of the pattern-formed unit region, determine a difference or the like, and output the difference. The difference value can be used as an index value for evaluating whether quality of a manufacturing result is good. The computer system 2 may determine whether the quality of the manufacturing result is good and output the result by comparing the difference value with a predetermined threshold as a kind of inspection. When the difference value is sufficiently small, it can be determined that a result of exposure or the like is good, a deviation from the design value is small, and the device is a non-defective product.

[Recipe]

An example of the imaging condition in the observation or inspection recipe is as follows. FIG. 9 is a diagram illustrating the imaging condition. The upper part of FIG. 9 illustrates the top surface of the wafer after the alignment chips 800 in FIG. 8 are determined. The lower part enlarges and illustrates a portion of two shots 303 from the top left, for example. A small rectangle indicates an example of a region 900 of an observation or inspection image. A size 901 is a size of the observation or inspection image. The size 901 of the observation or inspection image is smaller than, for example, the chip size 312. This example shows a case in which a region of all the shots and all the chips on the surface of the wafer are comprehensively observed or inspected in order from the top left, for example. In this case, an imaging condition that a plurality of observation or inspection images are captured consecutively in order from the top left is generated. As the imaging condition, the imaging number, the positions, the sizes 901, brightness, timings, and the like of the plurality of observation or inspection images are set. Positions V1, V2, and the like are examples of the imaging positions of the observation or inspection images. Even when the alignment chips 800 are used before the capturing of the observation or inspection images, movement or the like of the stage 102 is controlled such that an imaging position is matched to the position of the observation unit 103 in FIG. 1. Control information of the movement or the like of the stage 102 is also set in the recipe.

[GUI]

An example of the GUI according to the first embodiment will be described. The computer system 2 displays a screen including the GUI related to the foregoing functions on a display screen of the display device 107 in FIG. 1 for the user U1.

First, FIG. 10 is a diagram illustrating an example of a screen (a reference position coordinate input request screen) including the GUI on which the above-described reference position coordinates (x0, y0) can be designated. The GUI can be applied to step S101 or the like in FIG. 4. On the screen, an image obtained by imaging a part on the surface of the sample 101 is displayed as a monitor image in an image display region 1001. On the screen, a message or the like for prompting selection of the reference position coordinates is displayed. The user U1 can move an image of the image display region 1001 to a desired state of the upper, lower, right, or left side by operating an imaging region control button 1002 with the input device 108 (which may be a touch panel or the like) and moving the stage 102 to change an imaging position. After movement to a suitable imaging position (a corresponding image region), the user U1 moves a cursor 1003 to give an instruction for target reference position coordinates. The cursor 1003 is a cursor for selecting and designating the reference position coordinate (x0, y0) or the like. In a reference position coordinate display region 1004, values of the reference position coordinates (x, y) designated at that time are displayed. Alternatively, the user U1 can also input and designate values of the reference position coordinates in the reference position coordinate display region 1004. The user U1 presses an operation completion button 1005 when checking the displayed reference position coordinates and makes determination at that position. In response to this, the computer system 2 stores the designated reference position coordinates (x0, y0) in the storage device 106 or the like and completes the setting. When an operation stop button 1006 is pressed, the setting of the reference position coordinates is stopped.

FIG. 11 is a diagram illustrating a screen (a period determination result acceptance request screen) including a GUI for displaying a determination result of the above-described period or alignment information for the user U1, causing the user U1 to check the result and determine whether to accept the result. The screen of FIG. 11 is displayed, for example, after step S115 of FIG. 4. A message indicating that, please determine justification of determination result of the period or the like and determine whether to accept it, is displayed on this screen.

A determination image is displayed on this screen, as in the above-described example of FIG. 5. In this example, three images 1101A, 1101B, and 1101C are displayed in an image display region 1101. The image 1101A is equivalent to the reference image gt at the reference position coordinates (x0, y0). The image 1101B is an image at a position moved by one period from the reference position coordinates (x0, y0) in the X direction using the above-described calculated shot period 323 (Cx). The image 1101C is an image at a position moved by one period from the reference position coordinates (x0, y0) in the Y direction using the above-described calculated shot period 323 (Cy).

The values of the shot period 323 (Cx, Cy) in the X and Y directions are displayed in a period display region 1102. In this example, as described above, the shot period 323 is expressed as a unit (the number of chips) in which the period (cyc_out_x, cyc_out_y) related to the chips 302 is used, but the present disclosure is not limited thereto. The shot period 323 may be converted into another expression of a distance, the number of pixels, or the like. The number of chips may be set as more minute values by allowing a value of a decimal point or less.

The user U1 visually checks whether the shown pattern content is substantially the same (in other words, sufficiently similar) in three images, the reference image and other two images, displayed in the image display region 1101. Thus, the user U1 can check justification or suitability of the determination result of the period by the system.

When the user U1 checks and then accepts the result, the user U1 presses an acceptance button 1105. When the user U1 does not accept the result, the user U1 presses a rejection button 1106. In the case of the acceptance, the computer system 2 automatically sets the alignment information using the period. In the case of the rejection, the computer system 2 dismisses the period of the determination result and stops the flow. Alternatively, in the period display region 1102, the user U1 may change and adjust the value of the period. In this case, the computer system 2 acquires a checking image to match the changed value of the period and displays the image in the image display region 1101. The user U1 checks and determines the image again.

FIG. 12 is a diagram illustrating a display example of a screen (an alignment selection request image) including a GUI for allowing checking and correction of the above-described alignment chips 800. On this screen, an automatic selection result of the alignment chips 800 in step S115 of FIG. 4 is displayed. On this screen, a message indicating that, please correct disposition of the alignment chips as necessary, is displayed. On this screen, an automatic selection result of the plurality of alignment chips 800 on the surface of the wafer is displayed as a selection review in an alignment chip selection result display region 1201. The user U1 visually checks the disposition of the alignment chips 800 in the result and presses a completion button when accepting the disposition of the alignment chips 800. In this case, the computer system 2 reflects the alignment chips 800 in the recipe in step S116.

For example, workmanship of a circuit pattern at the end of the wafer is not good in some cases depending on a manufactured wafer. In these cases, it is not appropriate to use the circuit pattern at the end of the wafer for the alignment. In this case, the user U1 can change the disposition of the alignment chips on the screen.

A selection shot region 1202 has a shot selection toggle. The user U1 can move the shots used for the alignment (in other words, the shots for selecting the alignment chips) to move the shots in the radial direction of the wafer by operating the shot selection toggle. That is, the user U1 can select whether the selected shots are the outer circumferential set or the central or inner circumferential set in the radial direction of the wafer to correspond to the above-described first rule. For example, when the user U1 wants to change the positions of the alignment chips to positions closes to the center, the user U1 moves the shot selection toggle to a "wafer center." In response to this, the computer system 2 selects the alignment chips again by the changed rule. As a result, for example, the alignment chips are changed as in the chips 830 in FIG. 8.

A selection chip region 1203 has a chip selection button 1204 and an intra-shot position coordinate field 1205. In the chip selection button 1204, positions of the alignment chips 800 in an automatically selected shot are displayed to correspond to the above-described third rule. In the intra-shot position coordinate field 1205, the value of position coordinates (x, y) of the alignment chips 800 in the shot at that time are displayed. The position coordinates have a format in which the position of the top left chip in the shot is (1, 1) and the position of the central chip is (2, 2).

When the user U1 wants to check and change the positions of the alignment chips 800 in the shot, the user U1 can operate the chip selection button 1204 to change the positions of the alignment chips. For example, the positions of the chips can be selected by pressing a rectangle of each chip. Alternatively, the user U1 may designate values of the intra-shot position coordinate field 1205. The user U1 checks the alignment information and then presses the completion button so that the alignment information can be reflected. The computer system 2 stores the set alignment information (the positions or the like of the shot or alignment chips) in the storage device 106. The flow can be stopped with the stop button. In the automatic selection process for the alignment chips in step S115, the computer system 2 may select the alignment chips using the conditions designated or set by the user U1 in the past, for example, at the previous time, or may select the alignment chips using a condition which has been frequently used in the past. Thus, it is possible to further reduce the number of working processes.

FIG. 13 is a diagram illustrating a display example of another screen (a shot period and size measurement result screen) according to a modified example. This screen is a screen including a GUI on which the shot period 323 and the size specified in the above-described process are displayed as a measurement result so that the user U1 can check them. The shot period 323 (Cx, Cy) and the shot size 313 (Sx, Sy) have a predetermined relation, can be converted, and can be set to be the same values simply. On this screen, a specific result of the shots 303 on the surface of the wafer is displayed in a shot period and size measurement result region 1301. The specific result includes the specified chip separation or the shot separation as in FIG. 9 or the like. The value of the specified shot period 323 (Cx, Cy) and shot size 313 (Sx, Sy) are displayed in the shot period and size region 1302.

By mounting the GUI like the foregoing example, it is possible to support work for generating and setting the recipe for the user U1, reduce the work effort, and thus improve convenience. The GUI like the foregoing example can also be applied to a second embodiment or the like to be described below.

Advantageous Effects

As described above, according to the first embodiment, it is possible to reduce the work effort related to the generation of the recipe including the alignment information. According to the first embodiment, it is not necessary to have design information or the like including an exposure shot region. When the recipe is generated and set to automatically perform observation, inspection, measurement, and the like of a semiconductor device, it is possible to considerably shorten the number of processes, a time, and the like of the user.

For a sample such as a wafer, design information and design values including information such as the period related to the pattern-formed unit region of the chip, the shot, or the like are included in terms of design. In the observation or inspection (for example, semiconductor inspection including quality determination, and foreign matter detection) using the observation device 1, the design information or the design values are not known or cannot be acquired and referred to in some cases. Even in these cases, when this function is used, the actual period can be specified by estimation. An appropriate recipe including appropriate alignment positions can be automatically generated and set using the period. Besides, a period obtained actually as a manufacturing result of a device in a manufacturing process including exposure does not match a design value and slightly deviates from the design value in some cases. Even in these cases, when this function is used, an actual period of the manufacturing result can be specified. An appropriate recipe including the appropriate alignment positions can be automatically generated and set using the period. Since the appropriate recipe can be automatically generated and set, it is possible to reduce an effort for the user to perform manual setting work. Thus, it is possible to improve accuracy of the semiconductor inspection.

Second Embodiment

The second embodiment of the present disclosure will be described with reference to FIG. 14. A basic configuration of the second embodiment or the like is similar to that of the first embodiment. Hereinafter, a configuration of the second embodiment or the like different from that of the first embodiment will be described. In the second embodiment, another example of a calculation processing method of specifying a period of a pattern-formed unit region will be made. The second embodiment is different from the first embodiment in a method of determining similarity between images or the like. The scheme of the first embodiment is a scheme of comparing the similarity between the images to estimate an image with the same circuit pattern as the reference image gt and determining the period of the pattern-formed unit region. There is also concern of the value of the similarity between the images considerably varying in accordance with an image capturing environment or the like. In this case, the similarity also varies in the same circuit pattern, and thus pattern separation is likely to be difficult in accordance with a threshold. To take countermeasures against this case, in the second embodiment, a method of using information other than similarity of a correct pattern to determine a period is provided.

[Processing Flow]

FIG. 14 is a flowchart illustrating a main process in the computer system 2 (similar to that of FIG. 1) of the observation device 1 according to the second embodiment. The flowchart includes steps S201 to S219. Steps S201 to S210 are similar to steps S101 to S110 of FIG. 2. Thus, the computer system 2 acquires the similarity sim(i) between the reference image gt and each test image gi.

Thereafter, after step S211, the computer system 2 determines periodicity of the similarity sim(i). First, in step S211, the computer system 2 substitutes 2 into a period cyc which is a variable in the process. The period cyc of step S211 defines a lower limit for determining the period and a number other than 2 can also be used. Subsequently, in step S212, the computer system 2 calculates a correlation value evl(cyc) between the similarity sim(i) in $0 \leq i \leq cyc$ and the similarity sim(i) in $cyc \leq i \leq cyc \times 2$.

A correlation value evl between the data Ai and data Bi can be calculated with the following Expression C using an average value Av of the data Ai and an average value Bv of the data Bi.

$$ev1 = \Sigma(Ai-Av)(Bi-Bv)/\sqrt{(\Sigma(Ai-Av)^2)}\sqrt{(\Sigma(Bi-Bv)^2)} \quad \text{Expression C}$$

In the process of step S212, the same process is possible even when calculation of a periodic average value through Fourier analysis on the similarity sim(i) is used.

When the period cyc is less than N/2 in step S213 (Y), the computer system 2 adds 1 to the value of the period cyc in step S214 and returns to step S212 to repeat the process similarly. When the period cyc is equal to or greater than N/2 (N), the process proceeds to step S215.

In step S215, the computer system 2 determines, at the period cyc other than 2, that the period cyc at which the correlation value evl is the maximum is the period (cyc_out_x) related to the chip.

The process of step S215 can also be replaced in accordance with the following scheme. In this scheme, the correlation value evl(cyc) is normalized considering the period cyc to be a vector of an index, and then a periodic evaluation value evl_prod(cyc) is calculated from an inner product with a periodic evaluation vector evl_0(cyc). The periodic evaluation vector evl_0(cyc) is an N/2-dimensional unit vector, elements of indexes which are divided by the period cyc become the same value other than 0, and elements of indexes which are not divided by the period cyc become 0. The period cyc at which the calculated periodic evaluation value evl_prod(cyc) is the maximum is referred to as the period cyc_out_x.

The process until the foregoing step S215 is a process of determining the period cyc_out_x in the X direction, and steps S216 and S217 are a process of similarly determining the period cyc_out_y in the Y direction. In step S218, as in the first embodiment, the computer system 2 specifies the shot period based on the period (cyc_out_x, cyc_out_y) related to the chip and automatically selects the alignment chips for alignment. In step S219, a recipe including the alignment information is generated.

As described above, according to the second embodiment, it is possible to obtain the advantageous effects similar to those of the third embodiment.

Third Embodiment

The third embodiment will be described with reference to FIG. 15 and the like. The third embodiment is different from the first embodiment in an evaluation value used to determine the period. In the third embodiment, a feature amount of an image is used as a parameter for specifying the period rather than the above-described similarity. In the third embodiment, the period is specified based on comparison of a feature amount between images. The scheme of the first embodiment is a scheme of determining the period of the pattern-formed unit region by evaluating the similarity between the images. Here, in this scheme, calculation cost is large and a processing time is long in calculation of the similarity between the images in some cases. To take countermeasures against the case, a scheme of determining the period using the feature amount of the image is provided in the third embodiment.

[Processing Flow]

FIG. 15 is a flowchart illustrating a main process in the computer system 2 (similar to that of FIG. 1) of the observation device 1 according to the third embodiment. The flowchart has steps S301 to S317. Steps S301 and S302 are similar to the process of the above-described first or second embodiment. Here, while the similarity between two images is set as the evaluation value in the first or second embodiment, a feature amount is calculated from each image in the third embodiment. Therefore, in the flowchart of FIG. 15, step S303 is not a process of acquiring the reference image gt and is a process of acquiring the plurality of test images gi at each position as a plurality of determination images. The imaging positions of the images are the same as, for example, the position J1 and the like in FIG. 3 or 5. That is, in the third embodiment, the first test image g1 in which the reference position coordinates (x0, y0) are the first position is captured.

In step S304, the computer system 2 calculates a feature amount feat(i) of each image with regard to the plurality of acquired test images gi. As the feature amount feat(i), for example, one or a plurality of an average value of luminance values of an image, an average value of an image to which a differential filter is applied, average luminance of an upper class or a lower class of the above-described threshold hsim, a peak position or average luminance of Fourier-transformed images, and the number of pixels can be applied. Definition of the feature amount may be a previous setting value or may be selected and set to be variable by user setting. The feature amount may be automatically set, for example, based on a variation in the feature amount of each image with an image number (i) with regard to previously acquired data.

[Feature Amount]

FIG. 16 is a diagram illustrating an example in which the feature amount of each image is plotted. In the graph of FIG. 16, the horizontal axis represents the image number (i) of the plurality of test images gi and the vertical axis represents the feature amount feat(i) of each test image gi.

In the scheme of determining a period of the feature amount in the third embodiment, for example, the process (the scheme of using the correlation value) of steps S211 to S215 of FIG. 14 described in the second embodiment can be similarly applied, and steps S309 to S313 in FIG. 15 are equivalent. In step S313, the period (cyc_out_x) in the X direction is specified. After the stage 102 is moved in step S314, the period (cyc_out_x) in the Y direction is specified in the same process as the process in the X direction in step S315. Thereafter, as in the first embodiment, the alignment chips are automatically selected in step S316 and the recipe is generated in step S317.

As described above, according to the third embodiment, it is possible to obtain the advantageous effects similar to those of the first or second embodiment.

Fourth Embodiment

A fourth embodiment will be described with reference to FIG. 17 and the like. The fourth embodiment is different from the first embodiment in an image used to determine the period. In the fourth embodiment, as a determination image for specifying the period, one image with a large size is used rather than the plurality of above-described images. The size of one image is larger than the size of the image in the first to third embodiments. In the fourth embodiment, the period of the pattern-formed unit region is specified by determining a spatial frequency in one image based on Fourier transformation. The scheme of the first embodiment or the like is a scheme of moving the stage 102, capturing a plurality of images, and determining the period of the pattern-formed unit region from the images. In this scheme, accuracy of a position in imaging of an image depends on positioning accuracy of the stage 102 by a mechanical mechanism. Therefore, there is a problem when the period is desired to be measured with accuracy equal to or greater than the positioning accuracy of the stage 102. Accordingly, in the fourth embodiment, a method of determining the period of the pattern-formed unit region from one large image and automatically generating the recipe is provided.

[Processing Flow]

FIG. 17 is a flowchart illustrating a main process in the computer system 2 (similar to that of FIG. 1) of the observation device 1 according to the fourth embodiment. The flowchart has steps S401 to S412. First, in steps S401 and S402, the computer system 2 moves the stage 102 (corresponding stage position coordinates) to the input reference position coordinates (x0, y0). In step S403, the computer system 2 images and acquires one test image (referred to as an image gb) at the reference position coordinates. The computer system 2 performs a noise removing process on the test image as image processing in step S404 and performs an edge extraction process in step S405. The image processing is an example of a preferable process performed to determine a stable image period, and appropriate omission or addition and change in another image processing can be performed. An example of the other image processing is a process such as binarization, opening, or closing.

In the fourth embodiment, a size (a corresponding imaging region) of one determination image (the image gb) is assumed to include a plurality of shot regions. FIG. 19 is a diagram illustrating an example of the size (the corresponding imaging region) of one determination image (the image gb). In this example, the image gb has a size including 2×2 shots 303 in the X and Y directions. The size of one determination image can be applied without being limited thereto. For example, a plurality of images with smaller sizes may be acquired and a process of connecting these images may be performed to generate one determination image (the image gb). In the example of FIG. 19, the observation unit 103 captures, for example, a plurality of small images as in images 1901. One image gb can be generated by connecting these images.

As a modified example, when there is design information regarding the sample 101 such as a semiconductor device, for example, data of a design drawing, the design drawing may be applied as a determination image.

In step S406, the computer system 2 performs Fourier transformation on the image gb after the foregoing image processing to acquire an amplitude spectrum image (referred to as gbf) after the transformation.

In step S407, the computer system 2 acquires a data group of a luminance value profile (referred to as gbfx) at a central point (in the example of FIG. 18, (x, y)=(256, 256)) of the amplitude spectrum image gbf. The data group of the luminance value profile (gbfx) may be a profile obtained by averaging luminance values of given regions in the Y direction centering y=256 or taking a maximum value.

In step S408, the computer system 2 analyzes a peak position of one image gb using either primary differentiation or secondary differentiation and calculates a peak of an image center and a distance (a distance kx in FIG. 18) between the peak and a closest peak.

FIG. 18 is a diagram illustrating a method of calculating the distance kx. The upper part of FIG. 18 illustrates an example of the amplitude spectrum image gbf and the lower part illustrates an example of the corresponding luminance value profile (gbfx). The amplitude spectrum image gbf is, for example, an image with (512×512) pixels in the X and Y directions. A central point of the image is (x, y)=(256, 256). A stabler distance kx can be calculated by smoothing the luminance value profile (gbfx) before the calculation of the distance kx or providing a threshold for determining the peak. The distance kx between the illustrated peaks is a distance in a wave number space.

In step S409, the computer system 2 obtains a result obtained by dividing an imaged region (for example, 512 pixels in FIG. 18) in the X direction of one image gb by the distance kx as the period cyc_out_x related to the chip in the X direction.

In step S410, the computer system 2 obtains the period cyc_out_x related to the chip in the Y direction similarly to the process of steps S408 to S410 in the X direction. In steps S411 and S412, the computer system 2 specifies the shot period 312 using the period (cyc_out_x, cyc_out_y), selects the alignment chips based on the shot period 312, and generates the recipe including the alignment information.

As described above, according to the fourth embodiment, it is possible to obtain advantageous effects similar to those of the first to third embodiments.

The present invention has been described above based on the embodiments, but the present invention is not limited to the above-described embodiments and can be modified in various forms within the scope of the present invention without departing from the gist of the present invention. Each constituent element may be singular or plural when not particularly limited. The embodiments can also be combined. In each embodiment, constituent elements can be added, deleted, or replaced except for essential constituent elements.

REFERENCE SIGNS LIST

1: observation device
2: computer system
100: casing
101: sample
102: stage
103: observation unit
104: stage control unit
105: general control unit

The invention claimed is:

1. A computer system for an electron beam inspection apparatus that inspects a semiconductor sample using an image obtained by scanning an electron beam over the semiconductor sample,
wherein the computer system:
outputs control signals that control the electron beam inspection apparatus to move the semiconductor sample to a reference position and irradiate the semiconductor sample with the electron beam;
acquires a plurality of images for a plurality of chip regions repeatedly formed on a surface of the semiconductor sample from the electron beam inspection apparatus;
calculates a similarity of each image by comparing a reference image obtained at the reference position with each of the plurality of images;
sets each similarity that is equal to or greater than a threshold similarity as a candidate similarity;
specifies a shot region of the plurality of chip regions for each of the candidate similarities based on the similarity of each image; and
inspects the semiconductor sample with the electron beam inspection apparatus using the shot region;
wherein the computer system specifies a period or size of the shot region based on a period or size of the chip region; and
wherein the computer system provides a graphical user interface that displays an image at a reference position and an image at a position moved from the reference position at the period of the chip region or the period of the shot region for enabling a user to check and correct the period of the chip region or the period of the shot region based on a user operation of accepting or rejecting the period of the chip region or the period of the shot region.

2. The computer system of an observation device according to claim 1,
wherein the computer system performs control such that the specified shot region is displayed.

3. The computer system of an observation device according to claim 1,
wherein the graphical user interface provides for enabling to designate information regarding the period or size of the chip region based on a user operation.

4. The computer system of an observation device according to claim 1,
wherein the computer system provides a graphical user interface for enabling to designate information including positions at which the plurality of images on the surface of the semiconductor sample are captured based on a user operation.

5. The computer system of an observation device according to claim 1,
wherein the computer system selects a predetermined plurality of chip regions associated with observation or inspection alignment positions of the semiconductor sample based on the specified shot region and predetermined rules.

6. A computer system for an electron beam inspection apparatus that inspects a semiconductor sample using an image obtained by scanning an electron beam over the semiconductor sample,
wherein the computer system:
controls the electron beam inspection apparatus to move the semiconductor sample to a plurality of positions and irradiate the semiconductor sample with the electron beam;
acquires a plurality of images, including an image at each of the plurality of positions, for a plurality of chip regions repeatedly formed on a surface of semiconductor sample from the electron beam inspection apparatus;
calculates a feature amount of each of the plurality of images;
specifies a shot period and a shot region of the plurality of chip regions based on comparison of the feature amount between the plurality of images; and
inspects the semiconductor sample with the electron beam inspection apparatus using the shot period and the shot region;
wherein the computer system specifies a period or size of the shot region based on a period or size of the chip region; and
wherein the computer system provides a graphical user interface that displays an image at a reference position and an image at a position moved from the reference position at the period of the chip region or the period of the shot region for enabling a user to check and correct the period of the chip region or the period of the shot region based on a user operation of accepting or rejecting the period of the chip region or the period of the shot region.

7. A processing method in a computer system for an electron beam inspection apparatus that inspects a semiconductor sample using an image obtained by scanning an electron beam over the semiconductor sample, the method comprising:

outputting control signals for controlling the electron beam inspection apparatus to move the semiconductor sample to a reference position and irradiate the semiconductor sample with the electron beam;
acquiring, by the computer system, a plurality of images for a plurality of chip regions repeatedly formed on a surface of the semiconductor sample from the electron beam inspection apparatus;
calculating, by the computer system, a similarity of each image by comparing a reference image obtained at the reference position with each of the plurality of images; and
setting each similarity that is equal to or greater than a threshold similarity as a candidate similarity;
specifying, by the computer system, a shot region of the plurality of chip regions for each of the candidate similarities based on the similarity of each image; and
inspecting the semiconductor sample with the electron beam inspection apparatus using the shot region;
wherein the computer system specifies a period or size of the shot region based on a period or size of the chip region; and
wherein the computer system provides a graphical user interface that displays an image at a reference position and an image at a position moved from the reference position at the period of the chip region or the period of the shot region for enabling a user to check and correct the period of the chip region or the period of the shot region based on a user operation of accepting or rejecting the period of the chip region or the period of the shot region.

8. A processing method in a computer system for an electron beam inspection apparatus that inspects a semiconductor sample using an image obtained by scanning an electron beam over the semiconductor sample, the method comprising:
controlling the electron beam inspection apparatus to move the semiconductor sample to a plurality of positions and irradiate the semiconductor sample with the electron beam;
acquiring, by the computer system, a plurality of images, including an image at each of the plurality of positions, for a plurality of chip regions repeatedly formed on a surface of the semiconductor sample from the observation unit;
calculating, by the computer system, a feature amount of each of the plurality of images;
specifying, by the computer system, a shot period and a shot region of the plurality of chip regions based on comparison of the feature amount between the plurality of images; and
inspecting the semiconductor sample with the electron beam inspection apparatus using the shot period and the shot region;
wherein the computer system specifies a period or size of the shot region based on a period or size of the chip region; and
wherein the computer system provides a graphical user interface that displays an image at a reference position and an image at a position moved from the reference position at the period of the chip region or the period of the shot region for enabling a user to check and correct the period of the chip region or the period of the shot region based on a user operation of accepting or rejecting the period of the chip region or the period of the shot region.

* * * * *